United States Patent
Park et al.

(10) Patent No.: US 9,627,056 B2
(45) Date of Patent: Apr. 18, 2017

(54) RESISTIVE MEMORY DEVICE AND MEMORY SYSTEM INCLUDING RESISTIVE MEMORY DEVICE

(71) Applicant: Samsung Electronics Co., Ltd., Suwon-si, Gyeonggi-do (KR)

(72) Inventors: Mu-hui Park, Hwaseong-si (KR); Yeong-taek Lee, Seoul (KR); Dae-seok Byeon, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/009,814

(22) Filed: Jan. 28, 2016

(65) Prior Publication Data

US 2016/0358648 A1    Dec. 8, 2016

(30) Foreign Application Priority Data

Jun. 2, 2015  (KR) .......................... 10-2015-0078242

(51) Int. Cl.
G11C 13/00  (2006.01)

(52) U.S. Cl.
CPC .................................. *G11C 13/004* (2013.01)

(58) Field of Classification Search
USPC .................................................. 365/148, 203
See application file for complete search history.

(56) References Cited

U.S. PATENT DOCUMENTS

| 7,782,674 | B2 | 8/2010 | Roohparvar et al. |
| 7,936,626 | B2 | 5/2011 | Chen |
| 8,072,812 | B2 | 12/2011 | Roohparvar et al. |
| 8,355,283 | B2 | 1/2013 | Roohparvar et al. |
| 8,559,253 | B2 | 10/2013 | Kitagawa et al. |
| 8,559,256 | B2 | 10/2013 | Kim |
| 2006/0202743 | A1 | 9/2006 | Chung |
| 2009/0040821 | A1 | 2/2009 | Gallo et al. |
| 2009/0251981 | A1 | 10/2009 | Huang et al. |
| 2012/0218807 | A1 | 8/2012 | Johnson |
| 2012/0287730 | A1* | 11/2012 | Kim .................... G11C 11/5607 365/189.06 |
| 2013/0064008 | A1 | 3/2013 | Kim et al. |
| 2014/0177319 | A1* | 6/2014 | Park ..................... G11C 13/004 365/148 |

(Continued)

FOREIGN PATENT DOCUMENTS

| JP | 2012033219 | 2/2012 |
| KR | 20060099707 | 9/2006 |

(Continued)

*Primary Examiner* — Huan Hoang
*Assistant Examiner* — Minh Dinh
(74) *Attorney, Agent, or Firm* — Renaissance IP Law Group LLP

(57) ABSTRACT

A resistive memory device comprising: a memory cell having a programmable resistance representing stored data; and a read circuit configured to be connected to the memory cell via a first signal line and read the stored data, wherein the read circuit includes: a voltage controller configured to control a first voltage of the first signal line to be a constant voltage and output a signal to a sensing node; and a sense amplifier connected to the voltage controller via the sensing node, and configured to compare a sensing voltage of the sensing node with a reference voltage.

20 Claims, 34 Drawing Sheets

(56) References Cited

U.S. PATENT DOCUMENTS

| | | | |
|---|---|---|---|
| 2014/0177353 A1* | 6/2014 | Park | G11C 13/0002 365/189.14 |
| 2014/0197847 A1 | 7/2014 | Baker | |
| 2015/0162078 A1 | 6/2015 | Muralimanohar et al. | |

FOREIGN PATENT DOCUMENTS

| | | |
|---|---|---|
| KR | 20100068454 | 6/2010 |
| KR | 20150015012 | 2/2015 |

* cited by examiner

RESISTIVE MEMORY DEVICE AND MEMORY SYSTEM INCLUDING RESISTIVE MEMORY DEVICE

CROSS-REFERENCE TO RELATED APPLICATION

This application claims the benefit of Korean Patent Application No. 10-2015-0078242, filed on Jun. 2, 2015, in the Korean Intellectual Property Office, the disclosure of which is incorporated herein in its entirety by reference.

BACKGROUND

Embodiments relates to a memory device, and more particularly, to a resistive memory device and a memory system including the resistive memory device.

Memory devices may include memory cells having programmable resistances. In particular, multiple resistance thresholds may divide a range of the programmable resistance into ranges representing different states of multiple bits of data. A relationship between currents or times used to sense the programmable resistance may be non-linear with respect to resistance.

SUMMARY

An embodiment includes a resistive memory device comprising: a memory cell having a programmable resistance representing stored data; and a read circuit configured to be connected to the memory cell via a first signal line and read the stored data, wherein the read circuit includes: a voltage controller configured to control a first voltage of the first signal line to be a constant voltage and output a signal to a sensing node; and a sense amplifier connected to the voltage controller via the sensing node, and configured to compare a sensing voltage of the sensing node with a reference voltage.

An embodiment includes a memory system comprising a resistive memory device and a memory controller configured to control the resistive memory device, wherein the resistive memory device comprises: a memory cell configured to store at least 2 bits of data in a programmable resistance; a read circuit configured to be connected to the memory cell via a first signal line and read the at least 2 bits of data, the read circuit including: a voltage controller configured to control a first voltage of the first signal line to be a constant voltage and output a signal to a sensing node; and a sense amplifier connected to the voltage controller via the sensing node and configured to compare a sensing voltage of the sensing node with a reference voltage; and a sensing controller configured to generate a sensing enable signal that is activated at reference times respectively corresponding to a plurality of threshold resistances for reading the at least 2 bits of data, and provide the sensing enable signal to the sense amplifier.

An embodiment includes a resistive memory device comprising: a plurality of memory cells, each memory cell having a programmable resistance representing stored data; a read circuit; and a column decoder configured to selectively couple a selected memory cell of the memory cells to the read circuit; wherein the read circuit comprises a current control circuit configured to provide a constant current to a sense node based on the programmable resistance of the selected memory cell.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
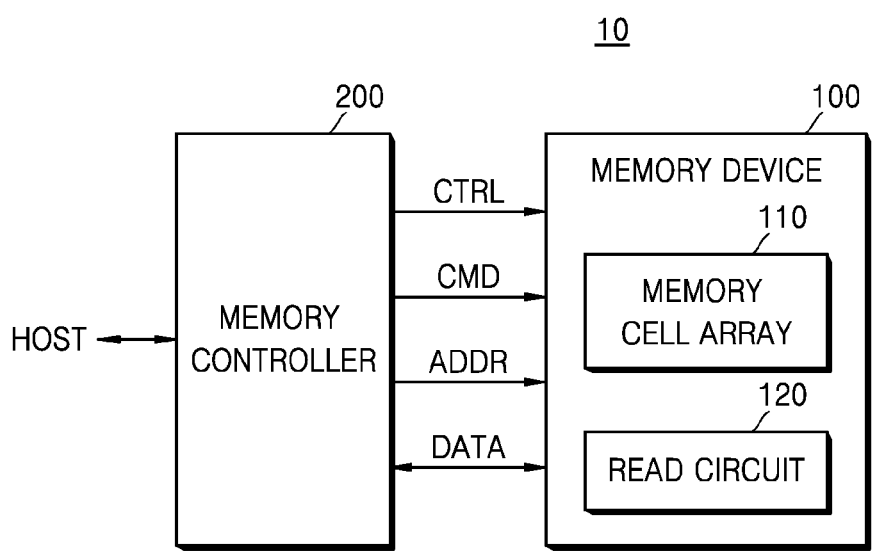
FIG. 1 illustrates a block diagram of a memory system according to an embodiment.

Embodiments will now be described more fully with reference to the accompanying drawings, in which particular embodiments are shown. The embodiments are provided so that this disclosure will be thorough and complete, and will fully convey the concepts of the embodiments to those skilled in the art. As embodiments allows for various changes and numerous variations, particular embodiments will be illustrated in the drawings and described in detail in the written description. However, this is not intended to limit embodiments to particular modes of practice, and it is to be appreciated that all changes, equivalents, and substitutes that do not depart from the spirit and technical scope are encompassed in the embodiments. Like reference numerals in the drawings denote like elements. Sizes of components in the drawings may be exaggerated for clarity.

The terms used in the present specification are merely used to describe particular embodiments, and are not intended to limit embodiments. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, a first element could be termed a second element, and, similarly, a second element could be termed a first element, without departing from the scope of exemplary embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a memory system according to an embodiment. Referring to FIG. 1, a memory system 10 may include a memory device 100 and a memory controller 200. The memory device 100 may include a memory cell array 110 and a read circuit 120.

In response to a write/read request from a host, the memory controller 200 may be configured to read data stored in the memory device 100 or may control the memory device 100 to write data to the memory device 100. In detail, the memory controller 200 may be configured to provide an address ADDR, a command CMD, and a control signal CTRL to the memory device 100 and thus may control a program (or write) operation, a read operation, and an erase operation in the memory device 100. Also, data DATA for a program operation and read data DATA may be transmitted between the memory controller 200 and the memory device 100. Also, data DATA to be written and read data DATA may be exchanged between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may be configured to control operations of the memory controller 200. The host interface may include a protocol for exchanging data between the host and the memory controller 200. For example, the memory controller 200 may be configured to communicate with an external source (i.e., the host) by using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), and Integrated Drive Electronics (IDE).

The memory cell array 110 may include a plurality of memory cells, and each of the memory cells may be connected between a first signal line and a second signal line. In an embodiment, the first signal line may be a bit line, and the second signal line may be a word line. In some embodiments, the first signal line may be a word line, and the second signal line may be a bit line.

In an embodiment, each of the memory cells may be a single-level cell configured to store one-bit data, and each of the memory cells may have two resistance distributions depending on stored data. In some embodiments, each of the memory cells may be a multi-level cell configured to store two-bit data, and the memory cell may have four resistance distributions depending on stored data. In some embodiments, each of the memory cells may be a triple-level cell configured to store three-bit data, and the memory cell may have eight resistance distributions depending stored data. However, embodiments are not limited thereto. In some embodiments, the memory cell array 110 may include memory cells that respectively store four or more bits of data. Also, the memory cell array 110 may include a multi-level cell or a triple-level cell as well as a single-level cell.

In the current embodiment, the memory cells may include a resistive memory cell including a variable resistor device (not shown) having a variable resistance depending on stored data. As one example, if a resistance of the variable resistor formed of a phase changeable material (e.g., Ge—Sb—Te (GST)) changes as a temperature changes, a resistive memory device may be phase change RAM (PRAM). As another example, when the variable resistor is formed by an upper electrode, a lower electrode, and transition metal oxide therebetween, the resistive memory device may be resistive RAM (RRAM). As another example, when the variable resistor includes an upper electrode including a magnetic material, a lower electrode including a magnetic material, and a dielectric therebetween, the resistive memory device may be magnetic RAM (MRAM). Although particular types of variable resistance memory cells have been used as examples, the resistive memory cells may include other types of variable resistors or variable resistance structures.

The read circuit 120 may be configured to perform a read operation on a selected memory cell from among multiple memory cells. The read circuit 120 may be configured to be selectively connected to a selected first signal line or a selected second signal line, which is connected to the selected memory cell. In an embodiment, the read circuit 120 may be configured to read data stored in a memory cell based on a cell current flowing in the memory cell. In some embodiments, the read circuit 120 may read data stored in a memory cell based on a sensing voltage at a sensing time.

In the current embodiment, the read circuit 120 may be connected to a memory cell via a first signal line and feed back a voltage of the first signal line, and thus control the voltage of the first signal line to be a constant voltage. Then, the read circuit 120 may detect data by comparing a sensing voltage that corresponds to a voltage of a first signal line with a reference voltage. For example, the first signal line may be a bit line, and hereinafter, a case in which the first signal line is a bit line will be described in detail. However, embodiments are not limited thereto, and the first signal line may be a word line.

In the current embodiment, the read circuit 120 may include an operational transconductance amplifier (OTA) to feed back a voltage of a first signal line. In the current embodiment, the OTA may be configured to receive an input voltage having a constant voltage level and a voltage of a first signal line, and then may output a control signal based on a difference between the input voltage and the voltage of the first signal line. The voltage of the first signal line may be controlled to be a constant voltage based on the control signal. In an embodiment, the OTA may be configured to use a voltage of the first signal line as negative feedback. In some embodiments, the OTA may be configured to use a voltage of the first signal line as positive feedback.

The memory controller 200 and the memory device 100 may be integrated into a semiconductor device. For example, the memory controller 200 and the memory device 100 may be integrated into a semiconductor device and thus may form at least part of a memory card. As one example, the memory controller 200 and the memory device 100 may be integrated into a semiconductor device and thus may form at least part of a PC card such as a peripheral computer memory card international association (PCMCIA) card, a compact flash card (CF), a smart media card (SM/SMC), a memory stick, a multimedia card such as MMC, RS-MMC, or MMCmicro, a secure digital card such as SD, miniSD, or microSD, or universal flash storage (UFS). As another example, the memory controller 200 and the memory device 100 may be integrated into a semiconductor device and thus may form at least part of a Solid State Disk/Drive (SSD).

Figure 2:
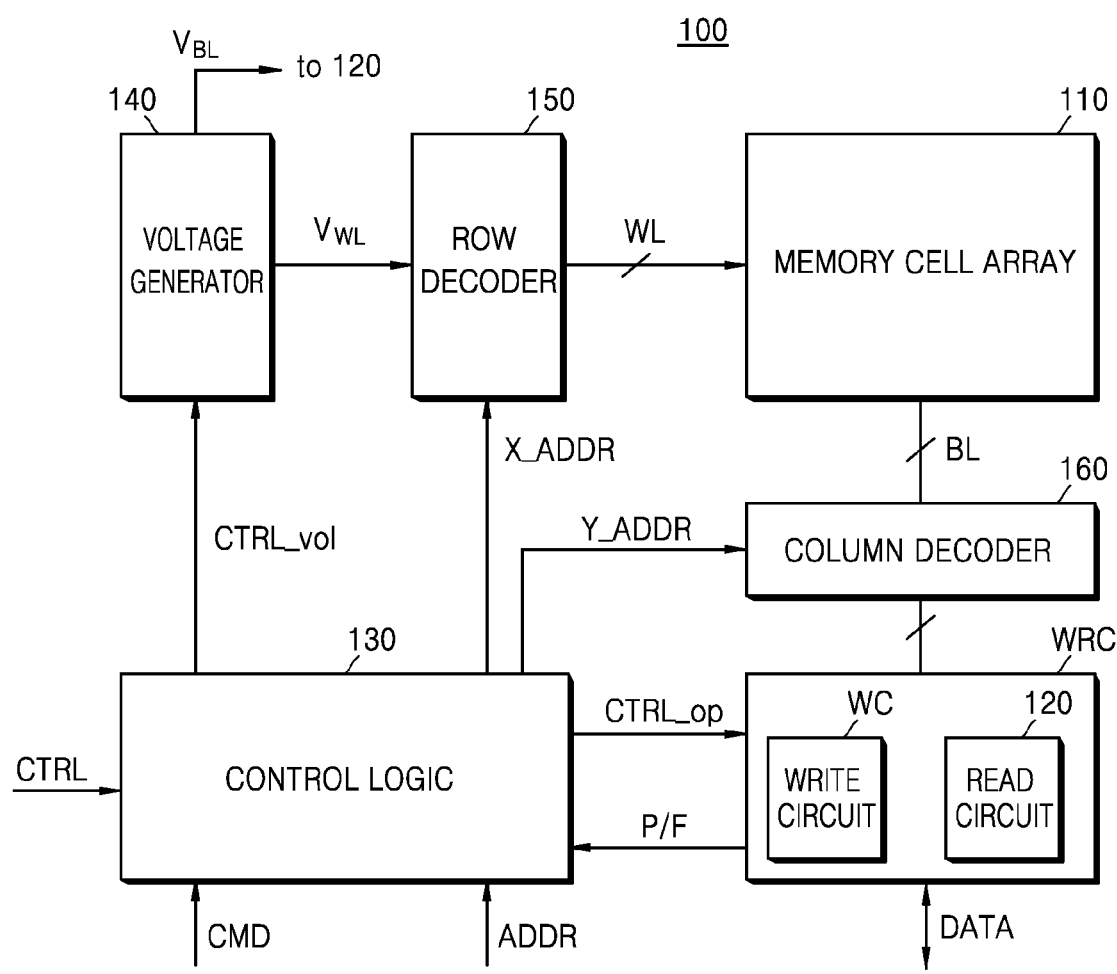
FIG. 2 illustrates a detailed block diagram of an example of a memory device included in a memory system of FIG. 1.

FIG. 2 illustrates a detailed block diagram of an example of the memory device 100 included in the memory system 10 of FIG. 1. Referring to FIG. 2, the memory device 100 may include the memory cell array 110, a write/read circuit WRC, a control logic 130, a voltage generator 140, a row decoder 150 and a column decoder 160, and the write/read circuit WRC may include a write circuit WC and the read circuit 120. Hereinafter, components included in the memory device 100 will be described.

The memory cell array 110 may be connected to multiple first signal lines and multiple second signal lines. Also, the memory cell array 110 may include the memory cells that are arranged respectively on regions where the first signal lines and the second signal lines cross each other. Hereinafter, one or more embodiments will be described under an assumption that the first signal lines are bit lines BL and the second signal lines are word lines WL as examples.

Figure 3:
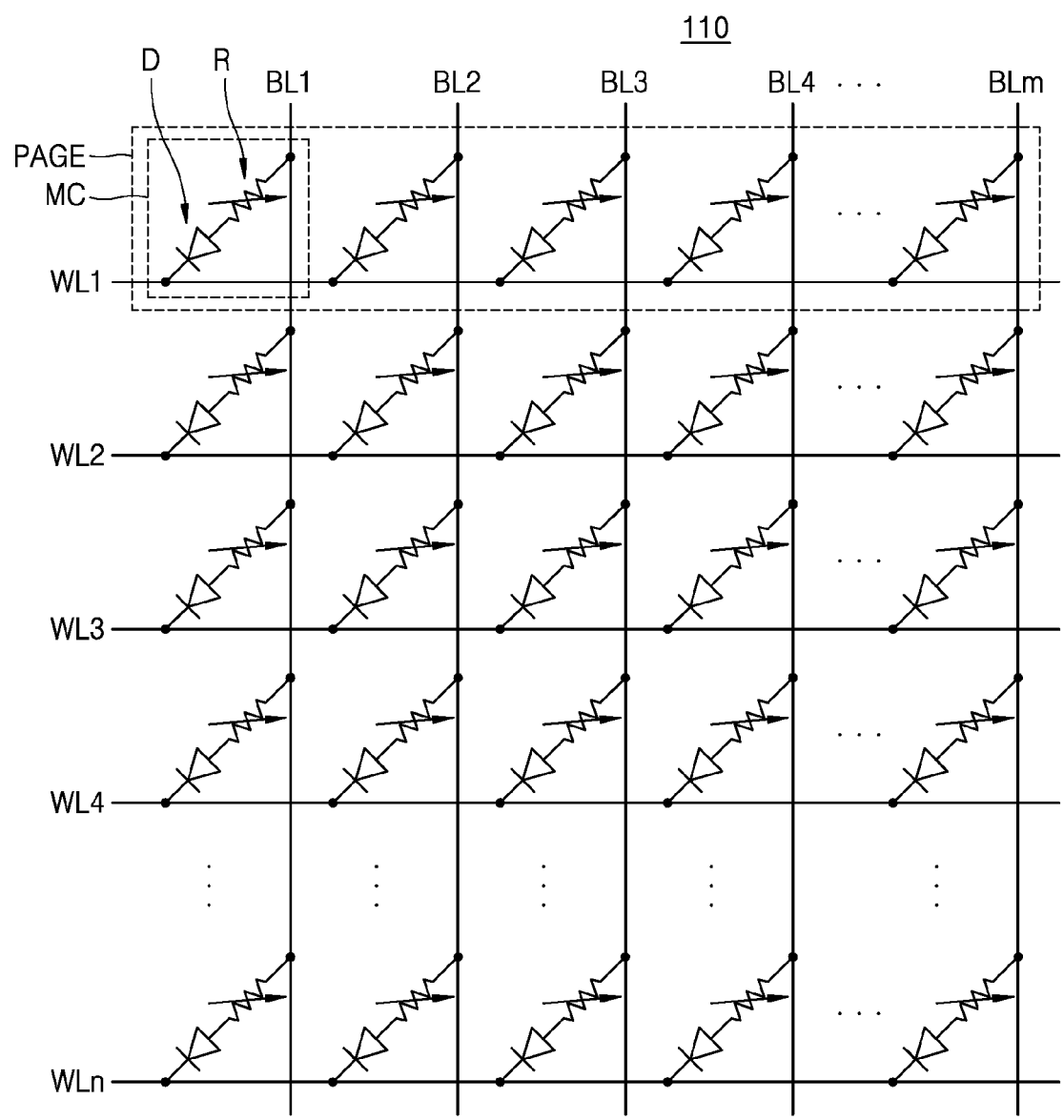
FIG. 3 illustrates a detailed circuit diagram showing the memory cell array of FIG. 2.

FIG. 3 illustrates a detailed circuit diagram showing the memory cell array 110 of FIG. 2. Referring to FIG. 3, the memory cell array 110 may be a horizontal memory having a two-dimensional structure and include multiple word lines WL1 to WLn, multiple bit lines BL1 to BLm and multiple memory cells MC. Here, the number of word lines WL, the number of bit lines BL and the number of memory cells MC may vary depending on the particular embodiment and may be the same or different. However, embodiments are not limited thereto. In some embodiments, the memory cell array 110 may be a vertical memory having a three-dimensional structure.

In the current embodiment, each of the memory cells MC may include a variable resistor R and a selection device D. Here, the variable resistor R may be referred to as a variable resistance material, and the selection device D may be referred to as a switching device.

In an embodiment, the variable resistor R may be electrically coupled between one of the bit lines BL1 to BLm and the selection device D, and the selection device D may be electrically coupled between the variable resistor R and one of the word lines WL1 to WLn. However, embodiments are not limited thereto. The selection device D may be electrically coupled between one of the bit lines BL1 to BLm and the variable resistor R, and the variable resistor R may be electrically coupled between the selection device D and one of the word lines WL1 to WLn.

The variable resistor R may be changed into one of multiple resistance states by an applied electric pulse or by another control technique. In an embodiment, the variable resistor R may include a phase changeable material that changes its crystalline state depending on an amount of a current applied. The phase changeable material may include various materials such as GaSb, InSb, InSe, and Sb2Te3 in which two elements are combined, GeTe, GeSbTe, GaSeTe, InSbTe, SnSb2Te4, and InSbGe in which three elements are combined, and AgInSbTe, (GeSn)SbTe, GeSb(SeTe), Te81Ge15Sb2S2 in which four elements are combined; however, the phase changeable material may take other forms.

The phase changeable material may have an amorphous state having a relatively high resistance and a crystal state having a relatively low resistance. In the phase changeable material, a phase may be changed by Joule heating generated according to an amount of a current applied. Accordingly, data may be written on the memory cell based on a phase change.

In some embodiments, the variable resistor R may include a perovskite compound, a transition metal oxide, a magnetic material, a ferromagnetic material or an anti-ferromagnetic material, instead of the phase changeable material.

The selection device D may be connected between one of the word lines WL1 to WLn and the variable resistor R corresponding thereto, and a current supplied to the variable resistor R may be controlled according to a voltage applied to the connected word line and a bit line. Although the selection device D is illustrated as a diode in FIG. 3, embodiments is not limited thereto. In some embodiments, the selection device D may be other switching devices.

Figure 4A:
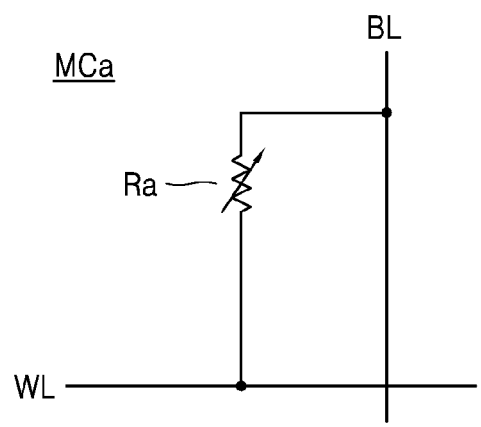
FIGS. 4A to 4C illustrate circuit diagrams of modifications of the memory cell MC of FIG. 3.
Figure 4B:
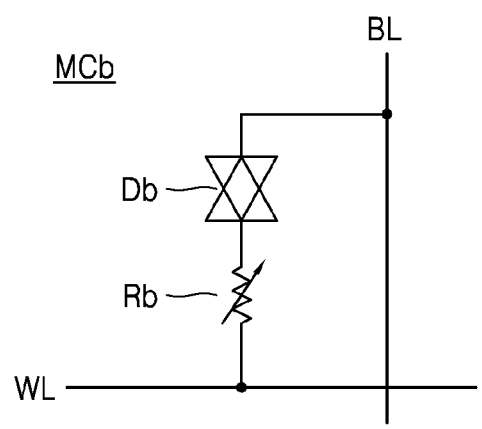
Figure 4C:
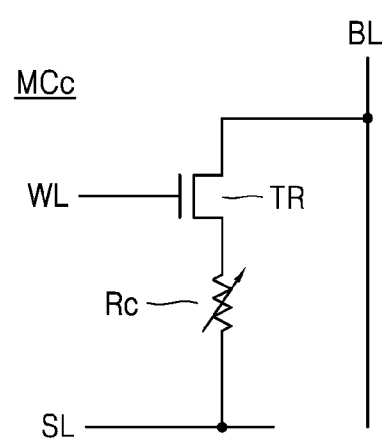

FIGS. 4A to 4C illustrate circuit diagrams of modifications of the memory cell MC of FIG. 3. Referring to FIG. 4A, a memory cell MCa includes a variable resistor Ra, and the variable resistor Ra may be connected to a bit line BL and a word line WL. The memory cell MCa may be configured to store data by using voltages applied to the bit line BL and the word line WL.

Referring to FIG. 4B, a memory cell MCb may include a variable resistor Rb and a bidirectional diode Db. The variable resistor Rb may include a resistance material to store data. The bidirectional diode Db is connected between the variable resistor Rb and the word line WL, and the variable resistor Rb may be connected between the bit line BL and the bidirectional diode Db. Locations of the bidirectional diode Db and the variable resistor Rb may be exchanged with each other. A leakage current flowing in non-selected resistor cells may be blocked by the bidirectional diode Db.

Referring to FIG. 4C, a memory cell MCc may include a variable resistor Rc and a transistor TR. The transistor TR may be a selection device, i.e., a switching device that supplies or blocks a current to the variable resistor Rc, according to a voltage of a word line WL. In the embodiment of FIG. 4C, a source line SL for adjusting voltage levels of ends of the variable resistor Rc may be further included, in addition to the word line WL. The transistor TR may be connected between the variable resistor Rc and the source line SL, and the variable resistor Rc may be connected between the bit line BL and the transistor TR. Locations of the transistor TR and the variable resistor Rc may be exchanged with each other. The memory cell MCc may be selected or may not be selected according to an on/off state of the transistor TR driven by the word line WL.

Referring back to FIG. 2, the write circuit WC may be connected to the selected bit line to provide a write pulse to the selected memory cell and then perform a write operation on the selected memory cell. In this regard, data DATA to be stored may be input to the memory cell array 110. In an embodiment, the write pulse may be a current pulse. In some embodiments, the write pulse may be a voltage pulse.

The read circuit 120 may be connected to the selected bit line and then be used to read stored data DATA from the selected memory cell. In detail, when the read circuit 120 receives a read command from the memory controller 200, the read circuit 120 may perform a general read operation on a memory cell. In addition, before performing a write operation on a memory cell, the read circuit 120 may perform a read operation on the memory cell to perform a pre-read operation for previously reading an initial resistance state of the memory cell. Furthermore, after performing the write operation on the memory cell, the read circuit 120 may perform a verify-read operation for determining whether a write operation on the memory cell has been completed.

Accordingly, the read circuit 120 may be configured to read each resistance of the memory cells, and provide a read result to the write circuit WC or the control logic 130. In detail, in a general read operation, the read circuit 120 may provide read data DATA to the outside of the memory device 100, i.e., the memory controller 200. Also, in the pre-read operation and the verify-read operation, the read circuit 120 may provide read data DATA to the inside of the memory device 100, i.e., the control logic 130 or the write circuit WC as a pass/fail signal P/F that indicates a success/failure of a write operation.

In the current embodiment, the write/read circuit WRC may be connected to the column decoder 160, and thus may be connected to a bit line. However, embodiments are not limited thereto. In some embodiments, the write/read circuit WRC may be connected to the row decoder 150, and thus may be connected to a word line.

The control logic 130 may be configured to output various control signals for writing data DATA on the memory cell array 110 or reading data DATA from the memory cell array 110 based on a command CMD, an address ADDR, and a control signal CTRL that are received from the memory controller 200. The various control signals output from the control logic 130 may be provided to the write/read circuit WRC, the voltage generator 140, the row decoder 150 and the column decoder 160, and thus, the control logic 130 may control overall operations of the memory device 100.

In detail, the control logic 130 may be configured to provide various operation control signals CTRL_op to the write/read circuit WRC. For example, the operation control signals CTRL_op may include a write enable signal, a read enable signal, a sensing enable signal, a discharge enable signal, a precharge enable signal and an OTA enable signal. Also, the control logic 130 may be configured to provide a voltage control signal CTRL_vol to the voltage generator 140. Furthermore, the control logic 130 may be configured to provide a row address X_ADDR to the row decoder 150, and provide a column address Y_ADDR to the column decoder 160.

The voltage generator 140 may be configured to generate various voltages to perform a write, a read and an ease operation for the memory cell array 110 based on the voltage control signal CTRL_vol. In detail, the voltage generator 140 may be configured to /generate a first driving voltage $V_{WL}$ for driving multiple word lines and a second driving voltage $V_{BL}$ for driving multiple bit lines. Here, the first driving voltage $V_{WL}$ may include a reset write voltage, a set write voltage, an inhibit voltage, a read voltage, a program verify voltage, or the like. Also, the second driving voltage $V_{BL}$ may include a reset write voltage, a set write voltage, an inhibit voltage, or the like. In a memory cell of the memory cell array 110, a reset write voltage and a set write voltage may be applied to a word line WL or a bit line BL according to a connection direction of the selection device D.

The row decoder 150 may be connected to the memory cell array 110 via multiple word lines WL, and may be configured to activate a word line selected from the word lines WL in response to the row address X_ADDR received from the control logic 130. In detail, the row decoder 150 may be configured to control a voltage that is applied to a word line selected from the word lines WL in response to the row address X_ADDR or may control a connection relation of the selected word line.

The column decoder 160 may be connected to the memory cell array 110 via multiple bit lines BL, and may be configured to activate a bit line selected from the bit lines BL in response to the column address Y_ADDR received from the control logic 130. In detail, the column decoder 160 may be configured to control a voltage applied to the bit line selected from the bit lines BL in response to the column address Y_ADDR or may control a connection relation of the selected bit line.

Figure 5A:
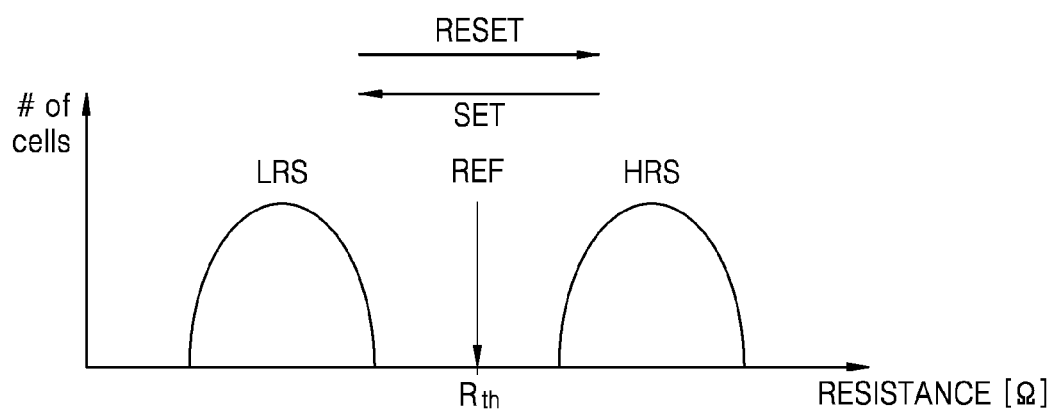
FIG. 5A illustrates a graph showing an example of distribution of a memory cell with respect to a resistance when the memory cell of FIG. 3 is a single-level cell.

FIG. 5A illustrates a graph showing an example of a distribution of a memory cell with respect to a resistance when the memory cell of FIG. 3 is a single-level cell. Referring to FIG. 5A, the horizontal axis denotes a resistance, and the vertical axis denotes the number of memory cells. For example, if a memory cell is a single-level cell to which 1 bit is programmed, the memory cell may have a low resistance state LRS or a high resistance state HRS. A set operation or a set write operation refers to a switching operation for the memory cell MC from the high resistance state HRS to the low resistance state LRS by applying a write pulse to the memory cell. In addition, a reset operation or a reset write operation refers to a switching operation for the memory cell MC from the low resistance state LRS to the high resistance state HRS by applying a write pulse to the memory cell.

A resistance between the distribution of the low resistance state LRS and the distribution of the high resistance state HRS may be set to be a threshold resistance $R_{th}$. In a read operation performed on a memory cell, when a read result is equal to or greater than the threshold resistance $R_{th}$, the read result may be determined to be the high resistance state HRS, and when the read result is less than threshold resistance $R_{th}$, the read result may be determined to be the low resistance state LRS.

In this case, information on a read reference REF corresponding to the threshold resistance $R_{th}$ may be received from the memory controller 200. The control logic 130 may set a read condition according to the information of the read reference REF, and the read condition may include a time at which a sensing enable signal, which is applied to the read circuit 120, is activated.

Figure 5B:
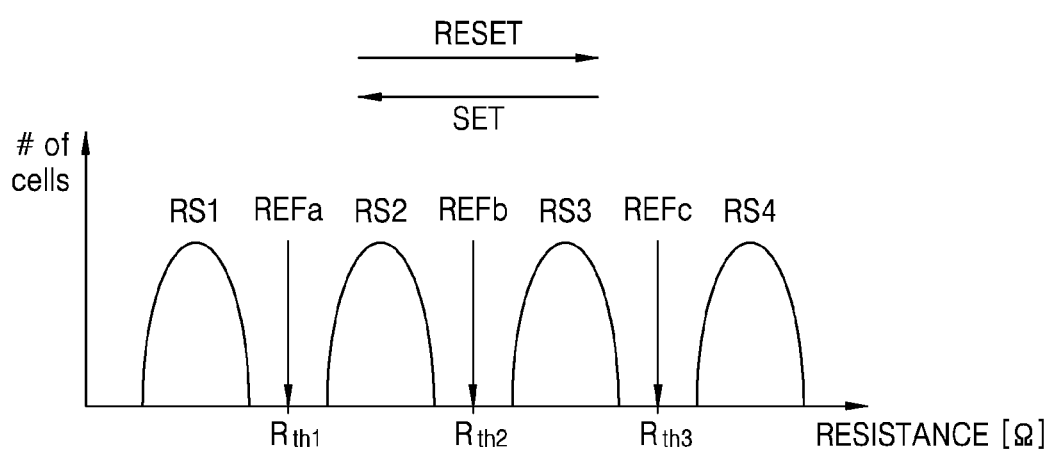
FIG. 5B illustrates a graph showing an example of distribution of a memory cell with respect to resistance when the memory cell of FIG. 3 is a multi-level cell.

FIG. 5B illustrates a graph showing an ideal distribution of a memory cell with respect to a resistance when the memory cell of FIG. 3 is a multi-level cell. Referring to FIG. 5B, the horizontal axis denotes resistance, and the vertical axis denotes the number of memory cells. For example, if a memory cell is a multi-level cell to which 2 bits are programmed, the memory cell may have one of a first resistance state RS1, a second resistance state RS2, a third resistance state RS3, and a fourth resistance state RS4. In an embodiment, the first resistance state RS1 and the second resistance state RS2 may be referred to as a low resistance state while the third resistance state RS3 and the fourth resistance state RS4 may be referred to as a high resistance state.

A resistance between the distribution of the first resistance state RS1 and the distribution of the second resistance state RS2 may be set to be a first threshold resistance $R_{th}$; a resistance between the distribution of the second resistance state RS2 and the distribution of the third resistance state RS3 may be set to be a second threshold resistance $R_{th2}$; and a resistance between the distribution of the third resistance state RS3 and the distribution of the fourth resistance state RS4 may be set to be a third threshold resistance $R_{th3}$. In a read operation performed on the memory cells MC, when a read result is equal to or greater than the first threshold resistance $R_{th1}$, the read result may be determined to be one of the second to fourth resistance states RS2, RS3, and RS4, and when the read result is less than the first threshold resistance $R_{th1}$, the read result may be determined to be the first resistance state RS1.

In this case, information on read references REFa, REFb, and REFc respectively corresponding to the first, second, and third threshold resistances $R_{th1}$, $R_{th2}$, and $R_{th3}$ may be received from the memory controller 200. The control logic 130 may generate a read condition according to the information on the read references REFa, REFb, and REFc, and the read condition may include a time at which a sensing enable signal, which is applied to the read circuit 120, is activated.

FIG. 5A or FIG. 5B illustrates an example of distribution of a memory cell.

However, an actual distribution of the memory cell may have a valley between two neighboring resistance states and a sensing margin may not be sufficiently large. In particular, in a distribution of a multi-level cell as illustrated in FIG. 5B, as a resistance level increases, a sensing margin may dramatically decrease.

Figure 6A:
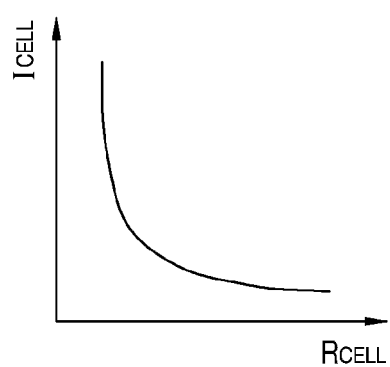
FIG. 6A illustrates a graph showing a cell current flowing in a memory cell with respect to resistance.

FIG. 6A illustrates a graph showing a cell current flowing in a memory cell with respect to resistance. Referring to FIG. 6A, the horizontal axis denotes a resistance level $R_{CELL}$ of a memory cell, and the vertical axis denotes a cell current $I_{CELL}$ flowing in the memory cell. The cell current $I_{CELL}$ is inversely proportional to the resistance level $R_{CELL}$, and thus, the cell current $I_{CELL}$ non-linearly decreases with respect to the resistance level $R_{CELL}$. In detail, when the resistance level $R_{CELL}$ is low, the cell currents $I_{CELL}$ changes by a relatively large amount in response to a resistance change, whereas when the resistance level $R_{CELL}$ is high, the cell current $I_{CELL}$ changes by a relatively small amount in response to the same change of resistance as stated above. Accordingly, when the resistance level $R_{CELL}$ is high, a sensing margin may dramatically decrease.

Figure 6B:
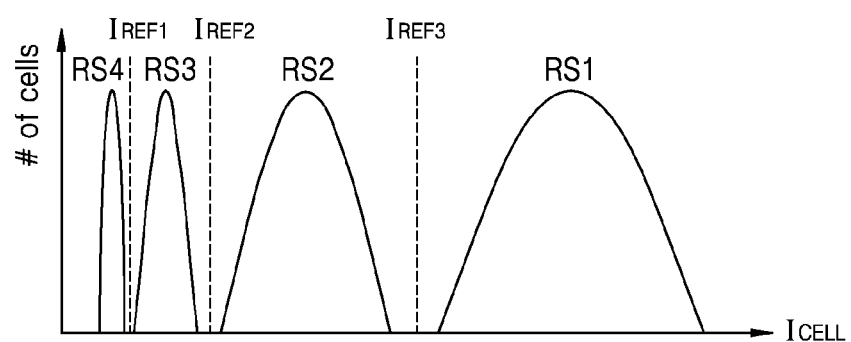
FIG. 6B illustrates a graph showing an example of an actual distribution of a memory cell with respect to a cell current when the memory cell is a multi-level cell.

FIG. 6B illustrates a graph showing an example of an actual distribution of a memory cell with respect to a cell current when the memory cell is a multi-level cell. Referring to FIG. 6B, the horizontal axis denotes a cell current $I_{CELL}$ flowing in a memory cell, and the vertical axis denotes the number of memory cells. When the memory cell is a multi-level cell, the memory cell may have one of a first resistance state RS1, a second resistance state RS2, a third resistance state RS3, and a fourth resistance state RS4.

For example, when reading data stored in a memory cell, the cell current $I_{CELL}$ is compared with a reference current $I_{REF}$, and then the reference current $I_{REF}$ may be changed to detect the data stored in the memory cell. The reference current $I_{REF}$ may be determined to be one of first, second, and third reference currents $I_{REF1}$, $I_{REF2}$, and $I_{REF3}$, and the first, second, and third reference currents $I_{REF1}$, $I_{REF2}$, and $I_{REF3}$ may respectively correspond to third, second, and first threshold resistances (for example, $R_{th3}$, $R_{th2}$, and $R_{th1}$ of FIG. 5B).

When the cell current $I_{CELL}$ is less than the first reference current $I_{REF1}$, the data stored in the memory cell may be determined to be the fourth resistance state RS4. When the cell current $I_{CELL}$ is less than the second reference current $I_{REF2}$, the data stored in the memory cell may be determined to be the third resistance state RS3. When the cell current $I_{CELL}$ is less than the third reference current $I_{REF3}$, the data stored in the memory cell may be determined to be the second resistance state RS2. When the cell current $I_{CELL}$ is greater than the third reference current $I_{REF3}$, the data stored in the memory cell may be determined to be the first resistance state RS1.

As illustrated in FIG. 6A, the cell current $I_{CELL}$ is inversely proportional to the resistance level $R_{CELL}$. Accordingly, as the resistance level $R_{CELL}$ increases, and as the cell current $I_{CELL}$ decreases, a sensing window decreases. The sensing window non-linearly changes with respect to the resistance level, and thus, in a multi-level cell, a read performance for a high resistance state may degrade.

Figure 7:
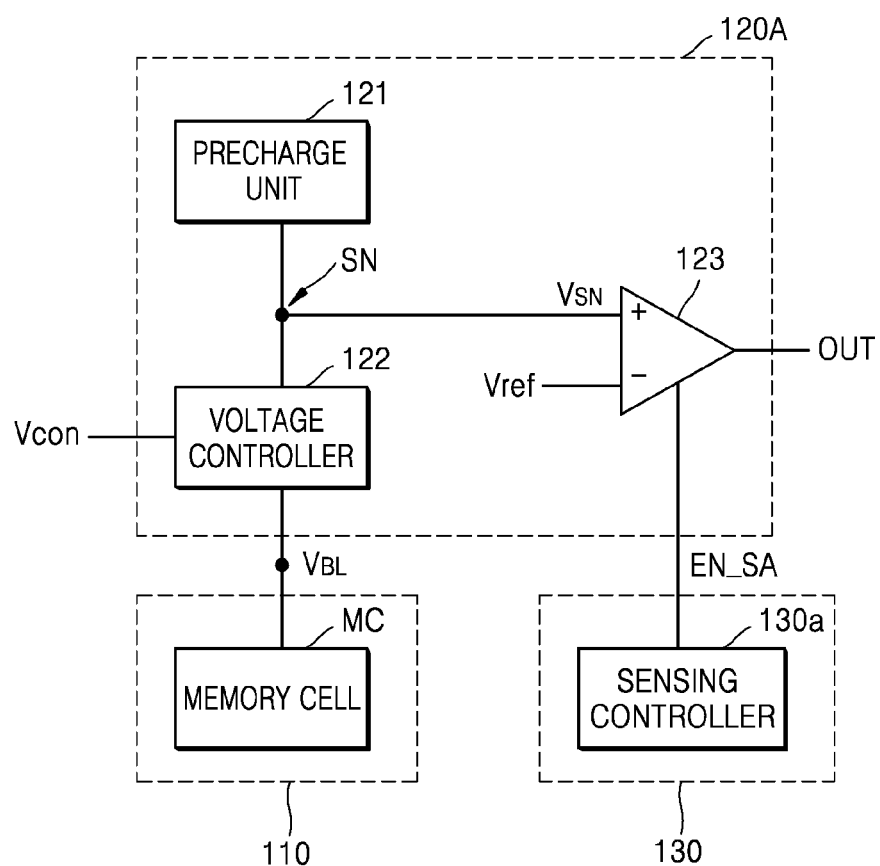
FIG. 7 illustrates a block diagram showing an example of a memory device including a read circuit according to an embodiment.

FIG. 7 illustrates a block diagram showing an example 100a of a memory device including a read circuit 120A according to an embodiment. Referring to FIG. 7, the memory cell array 110 may include a memory cell MC, and the memory cell MC may be connected to the read circuit 120A via a first signal line. Hereinafter, a case in which the first signal line is a bit line (for example, BL of FIG. 2) will be described. In an embodiment, an end of the memory cell MC may be connected to the bit line, and the other end thereof may be connected to a word line (for example, WL of FIG. 2). In a read operation performed on the memory cell MC, a voltage of the word line may be substantially at a ground voltage level. In this regard, a voltage of the memory cell MC, that is, a cell voltage, may correspond to a bit line voltage $V_{BL}$.

Hereinafter, the bit line may refer to any line for transmitting a signal between the memory cell MC and a sense amplifier 123. In detail, the bit line may include a local bit line between the memory cell MC and a bit line selection circuit, a global bit line between the bit line selection circuit and a voltage controller 122, and a data sensing line between the voltage controller 122 and the sense amplifier 123.

The read circuit 120A may include a precharge unit 121, the voltage controller 122, and the sense amplifier 123. During a precharge period, the precharge unit 121 may precharge the bit line to a voltage level. When the precharge period ends and a development period starts, the precharge unit 121 is deactivated, and thus, a precharge operation for the bit line may be terminated. The precharge unit 121 may be connected to the voltage controller 122 and the sense amplifier 123 via a sensing node SN.

The voltage controller 122 may be connected to the memory cell MC via the bit line. In the current embodiment, the voltage controller 122 may be configured to receive as feedback a bit line voltage $V_{BL}$ to generate a control signal changed according to the bit line voltage $V_{BL}$, and control the bit line voltage $V_{BL}$ to be a constant voltage based on the generated control signal. In detail, the voltage controller 122 may be configured to generate a control signal based on a difference between an input voltage Vcon having a constant voltage level and the bit line voltage $V_{BL}$, and control the bit line voltage $V_{BL}$ to be a constant voltage based on the generated control signal.

The sense amplifier 123 may be connected to the voltage controller 122 via the sensing node SN, and may be configured to detect data stored in the memory cell MC by comparing a sensing voltage $V_{SN}$ of the sensing node SN with a reference voltage Vref. In detail, the sense amplifier 123 may be enabled by a sensing enable signal EN_SA, and perform a comparison operation of comparing a sensing voltage $V_{SN}$ with the reference voltage Vref during a period in which the sensing enable signal EN_SA is activated.

The control logic 130 may include a sensing controller 130a. However, embodiments are not limited thereto. In some embodiments, the sensing controller 130a may be included in the memory controller 200. In the current embodiment, the sensing controller 130a may be configured to generate sensing enable signals EN_SA that are activated at multiple reference timings respectively corresponding to multiple threshold resistances for reading data.

Figure 8:
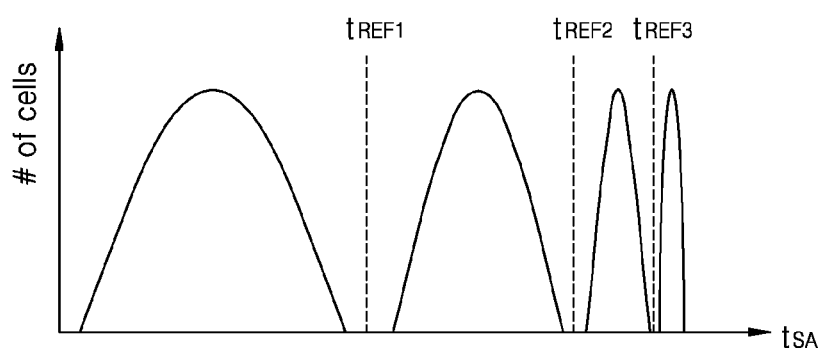
FIG. 8 illustrates a graph showing an example of an actual distribution of a memory cell with respect to a sensing time when the memory cell is a multi-level cell.

FIG. 8 illustrates a graph showing an example of an actual distribution of a memory cell with respect to a sensing time when the memory cell is a multi-level cell. Referring to FIG. 8, the horizontal axis denotes a sensing time $t_{SA}$, and the vertical axis denotes the number of memory cells. First, second, and third reference times $t_{REF1}$, $t_{REF2}$, and $t_{REF3}$ are reference times for detecting data stored in a memory cell, and may respectively correspond to first, second, and third threshold resistances (for example, $R_{th1}$, $R_{th2}$, and $R_{th3}$ of FIG. 5B).

In the read circuit 120A illustrated in FIG. 7, the sensing voltage $V_{SN}$ of the sensing node SN may be discharged at various speeds according to a resistance of the memory cell MC. In this regard, an activation time of the sensing enable signal EN_SA may be adjusted to control an enable time of the sense amplifier 123, that is, the sensing time $t_{SA}$, in order to detect a state of the memory cell MC, that is, data stored in the memory cell MC.

Here, although a precharge voltage is provided to a bit line to precharge the bit line, depending on an effect of distributing resistances between a resistance component of the voltage controller 122 and a resistance of the memory cell MC, the bit line voltage $V_{BL}$, which is actually precharged, may vary according to a resistance of the memory cell MC. Accordingly, a relation between the sensing time $t_{SA}$ and a sensing window may be non-linear, as illustrated in FIG. 8.

Figure 9:
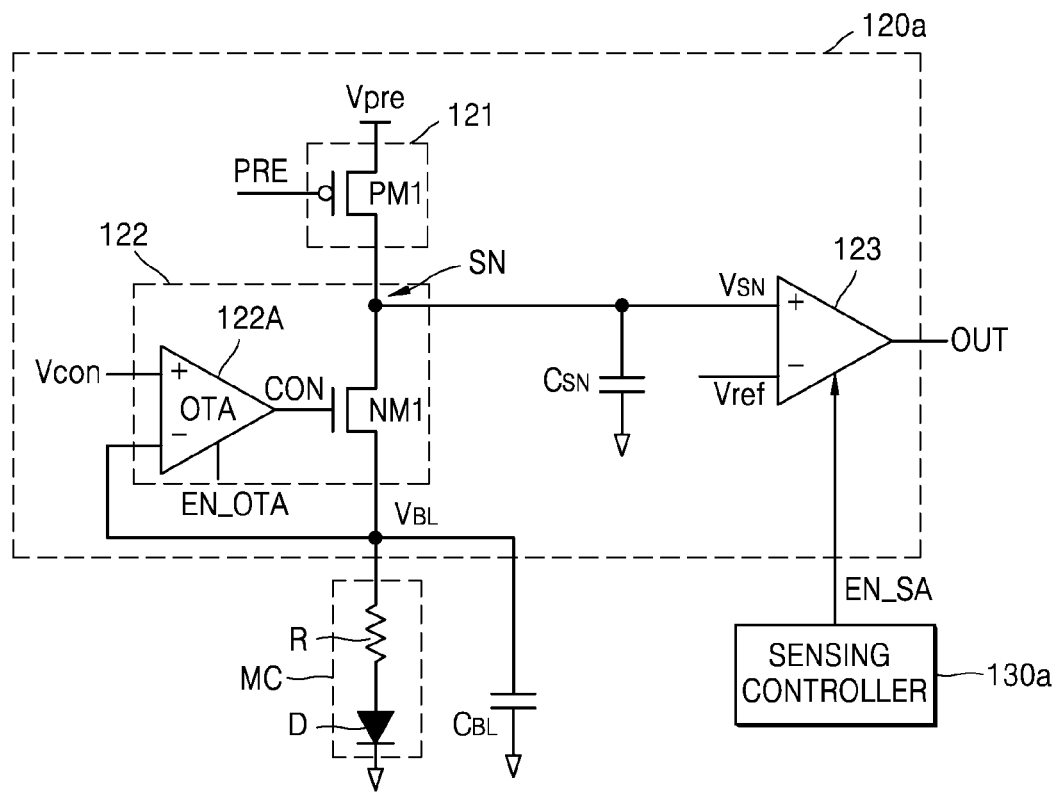
FIG. 9 illustrates an example of a read circuit according to an embodiment.

FIG. 9 illustrates an example 120a of a read circuit according to an embodiment of embodiments. Referring to FIG. 9, the precharge unit 121 may include a PMOS transistor PM1 having a source connected to a precharge voltage Vpre terminal, a gate to which a precharge enable signal PRE is applied, and a drain connected to the sensing node SN. The precharge enable signal PRE may be activated during a precharge period and be provided to the control logic 130. When the precharge enable signal PRE is activated, the PMOS transistor PM1 may provide a precharge voltage Vpre to the sensing node SN.

The voltage controller 122 may include an OTA 122A and an NMOS transistor NM1. The OTA 122A may use the bit line voltage $V_{BL}$ as negative feedback and thus generate a control signal CON changed by the bit line voltage $V_{BL}$. The NMOS transistor NM1 may be configured to control the bit line voltage $V_{BL}$ to be a constant voltage according to the control signal CON.

The OTA 122A may include a first input terminal for receiving an input voltage Vcon that has a constant voltage level, a second input terminal for receiving the bit line voltage $V_{BL}$, and an output terminal for providing the control signal CON. In the current exemplary embodiment, the first input terminal may be a non-inverting terminal, and the second input terminal may be an inverting terminal. In this regard, the OTA 122A may use the bit line voltage $V_{BL}$ as negative feedback and thus generate the control signal CON changed by the bit line voltage $V_{BL}$.

The OTA 122A may be enabled during an activation period of the OTA enable signal EN_OTA so as to generate the control signal CON. The OTA enable signal EN_OT may be activated during a read period of the memory cell MC. In the current embodiment, The OTA enable signal EN_OT may be activated during a precharge period and a development period.

The NMOS transistor NM1 may include a drain connected to the sensing node SN, a gate to which the control signal CON is applied, and a source connected to the memory cell MC. The NMOS transistor NM1 may be configured to clamp the bit line voltage $V_{BL}$ to be in a range that is suitable for reading, and accordingly, the NMOS transistor NM1 may be referred to as a clamping transistor. In detail, the NMOS transistor NM1 may clamp the bit line voltage $V_{BL}$ to be a constant level according to the control signal CON.

Hereinafter, a detailed operation of the voltage controller 122 will be described. The OTA 122A may generate an output current that is increased according to the difference between the input voltage Vcon and the bit line voltage $V_{BL}$, and then, may increase a voltage level of the control signal CON based on the generated output current. For example, when the bit line voltage $V_{BL}$ is lower than the input voltage Vcon, an output current of the OTA 122A may increase, and thus, a voltage level of the control signal CON may increase. Accordingly, the amount of current flowing in the NMOS transistor NM1 may increase, and thus, the amount of electric charge accumulated in a capacitor $C_{BL}$ may increase to increase the bit line voltage $V_{BL}$.

As the bit line voltage $V_{BL}$ increases, the difference between the bit line voltage $V_{BL}$ and the input voltage Vcon decreases, and then the amount of output current of the OTA 122A may decrease and a voltage level of the control signal CON may decrease. As a result, the amount of current flowing in the NMOS transistor NM1 may decrease and the amount of electric charge accumulated in the capacitor $C_{BL}$ may decrease as to decrease the bit line voltage $V_{BL}$. In this regard, the bit line voltage $V_{BL}$ may have substantially the same voltage level as the input voltage Vcon.

In the current embodiment, the input voltage Vcon is a constant voltage having a constant voltage level, and thus, the bit line voltage $V_{BL}$ may also be a constant voltage having a constant voltage level. In the current embodiment, the voltage controller 122 may control the bit line voltage $V_{BL}$ to be a constant voltage, independently from the memory cell MC. Accordingly, the bit line voltage $V_{BL}$ precharged by the precharge unit 121 may have a constant value, independently from a resistance of the memory cell MC.

The sense amplifier 123 may include a first input terminal to which the sensing voltage $V_{SN}$ is applied and a second input terminal to which the reference voltage Vref is applied, and may be enabled during an activation period of the sensing enable signal EN_SA to generate an output signal OUT. In the current embodiment, the first input terminal may be a non-inverting input terminal, and the second input terminal may be an inverting input terminal. For example, when the sensing voltage $V_{SN}$ is greater than the reference voltage Vref, a logic level of the output signal OUT may be 1, and when the sensing voltage $V_{SN}$ is less than the reference voltage Vref, a logic level of the output signal OUT may be 0.

Figure 10:
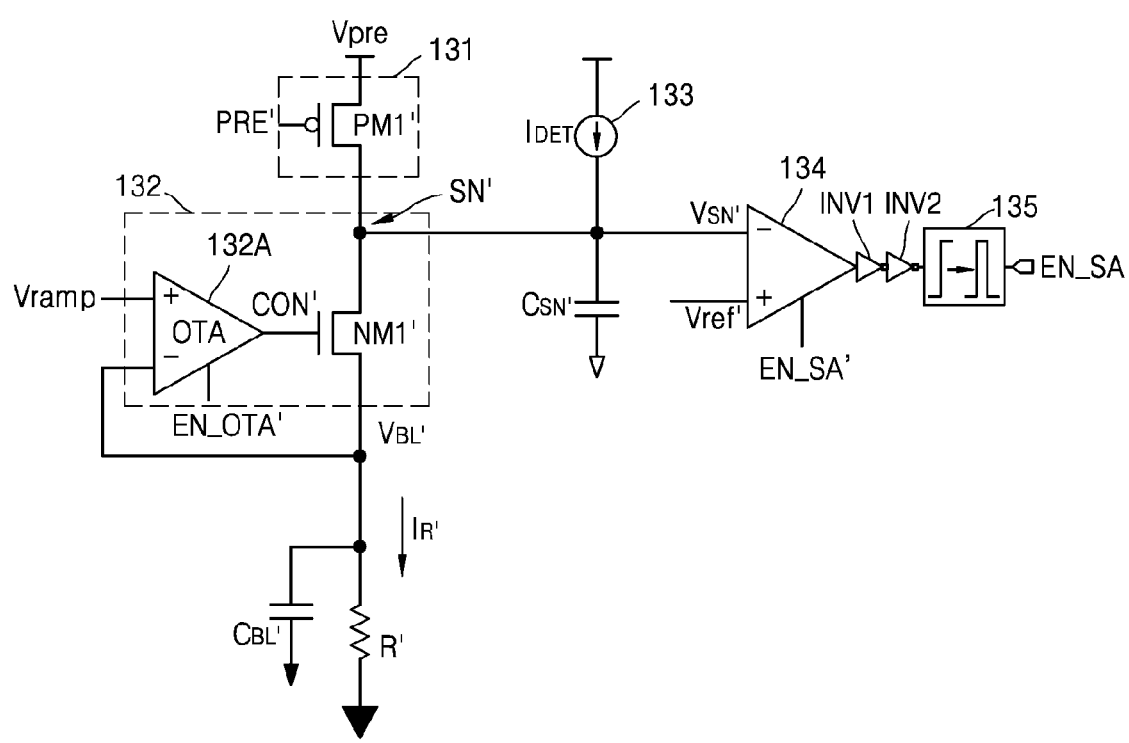
FIG. 10 illustrates a circuit diagram showing an example of a sensing controller according to an embodiment.
Figure 11:
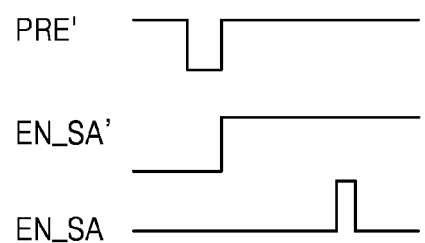
FIG. 11 illustrates a timing view of voltage levels of signals applied to the sensing controller of FIG. 10.

FIG. 10 illustrates a circuit diagram showing an example 130a of a sensing controller according to an embodiment. FIG. 11 illustrates a timing view of voltage levels of signals applied to the sensing controller 130a of FIG. 10. Hereinafter, referring to FIGS. 10 and 11, a configuration and operations of the sensing controller 130a will be described.

The sensing controller 130a may include a precharge unit 131, a voltage controller 132, a current generator 133, a comparator 134, and the resistor R'. The sensing controller 130a may further include inverters INV1 and INV2 and a pulse generator 135. In this regard, the sensing controller 130a may be embodied by a circuit similar to the circuit of the read circuit 120A and the memory cell MC illustrated in FIG. 9.

The precharge unit 131 may include a source connected to a precharge voltage terminal Vpre, a gate to which a precharge enable signal PRE' is applied, and a PMOS transistor PM1' having a drain connected to a sensing node SN'. The precharge enable signal PRE' may be activated during a precharge period, and the control logic (for example, 130 of FIG. 2) may provide the precharge enable signal PRE'. When the precharge enable signal PRE' is activated, the PMOS transistor PM1' may provide the precharge voltage Vpre to the sensing node SN'. For example, when the precharge enable signal PRE' is at a low level, the PMOS transistor PM1' may be activated to provide the precharge voltage Vpre to the sensing node SN'.

The voltage controller 132 may include an OTA 132A and an NMOS transistor NM1'. The OTA 132A may be configured to use the bit line voltage $V_{BL}$' as negative feedback and thus generate a control signal CON' changed by the bit line voltage $V_{BL}$'. In the current embodiment, the NMOS transistor NM1' may be configured to control the bit line voltage $V_{BL}$' to be a ramp voltage according to the control signal CON'.

The OTA 132A may include a first input terminal configured to receive a ramp voltage Vramp that has a voltage level that linearly increases over time, a second input terminal to receive the bit line voltage $V_{BL}$', and an output terminal to provide the control signal CON'. In the current embodiment, the first input terminal may be a non-inverting input terminal, and the second input terminal may be an inverting input terminal. In this regard, the OTA 132A may use the bit line voltage $V_{BL}$' as negative feedback, and thus generate the control signal CON' changed by the bit line voltage $V_{BL}$'.

The OTA 132A may be enabled during an activation period of an OTA enable signal EN_OTA' to generate the control signal CON'. The OTA enable signal EN_OTA' may be activated during a read period of the memory cell MC. In the current embodiment, the OTA enable signal EN_OTA' may also be activated during a precharge period and a development period.

The NMOS transistor NM1' may include a drain connected to the sensing node SN', a gate to which the control signal CON' is applied, and a source connected to the resistor R. Operations of the voltage controller 132 are substantially the same as the operations of the voltage controller 122 of FIG. 9, and thus, detailed descriptions will be omitted.

In the current embodiment, the input voltage Vramp may be a ramp voltage, and thus the bit line voltage $V_{BL}$' may also be a ramp voltage. Accordingly, a first current $I_{R'}$ flowing in the resistor R' may be embodied as a ramp current, which is similar to a behavior of a ramp voltage. In the current embodiment, the voltage controller 132 may be configured to control the bit line voltage $V_{BL}$' to be a ramp voltage, and thus, the first current $I_{R'}$ flowing in the resistor R' may be controlled to be a ramp current.

The current generator 133 may be configured to generate a second current $I_{DET}$ changed according to a reference time. The comparator 134 may include a first input terminal to which the sensing voltage $V_{SN}$' of the sensing node SN' is applied, and a second input terminal to which the reference voltage Vref is applied, and may be enabled during an activation period of a sensing enable signal EN_SA' to generate an output signal. The sensing enable signal EN_SA' may be activated after a precharge period has ended, i.e., during a development period, and may be provided by the control logic (for example, 130 of FIG. 2).

The inverters INV1 and INV2 may be configured to buffer an output signal of the comparator 134, and the pulse generator 135 may generate a pulse signal based on the buffered output signal. The generated pulse signal may correspond to the sensing enable signal EN_SA. As a result, at a time when the first current $I_{R'}$ that linearly increases over time meets the second current $I_{DET}$, the sensing enable signal EN_SA may be activated.

However, embodiments are not limited thereto. In some embodiments, a sensing controller may include a delay circuit including multiple delay units. Here, an enable signal for the delay units may be changed according to a resistance level to read, and may be generated by a control logic. In some embodiments, a sensing controller may be embodied by a clock generator including an oscillator. Here, a period of a clock output from the clock generator may be controlled by control logic.

Figure 12:
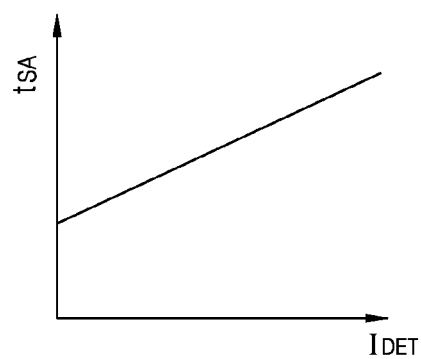
FIG. 12 illustrates a graph showing a relation between a sensing time and a second current in the sensing controller of FIG. 10.

FIG. 12 illustrates a graph showing a relation between the sensing time $t_{SA}$ and the second current $I_{DET}$ in the sensing controller 130a of FIG. 10. Referring to FIG. 12, the horizontal axis denotes the second current $I_{DET}$ and the vertical axis denotes the sensing time $t_{SA}$. The sensing time $t_{SA}$ refers to a time at which the sensing enable signal EN_SA is activated. In the current embodiment, a behavior of the bit line voltage $V_{BL}'$ may be substantially the same as the ramp voltage Vramp, and thus may be represented by Formula 1 below.

$$V_{BL}'=\alpha t \quad \text{[Formula 1]}$$

Wherein α is a constant and t denotes time. In this regard, the bit line voltage $V_{BL}'$ linearly increases over time, and the first current $I_{R'}$ flowing in the resistor R' may be represented by Formula 2 below.

$$I_{R'}=(\alpha t)/RL \quad \text{[Formula 2]}$$

Herein, RL denotes a resistance level of the resistor R'. As described with reference to FIG. 10, at a time at which the first current $I_{R'}$ matches the second current $I_{DET}$ (that is, $I_{DET}=(\alpha t)/RL$), the sensing enable signal EN_SA is activated, and thus, the sensing time $t_{SA}$ may be represented by Formula 3 below.

$$t_{SA}=I_{DET}*RL/\alpha \quad \text{[Formula 3]}$$

Accordingly, the sensing time $t_{SA}$ is linearly proportional to the second current $I_{DET}$. In the current exemplary embodiment, the second current $I_{DET}$ may be adjusted to control the sensing time $t_{SA}$.

Figure 13:
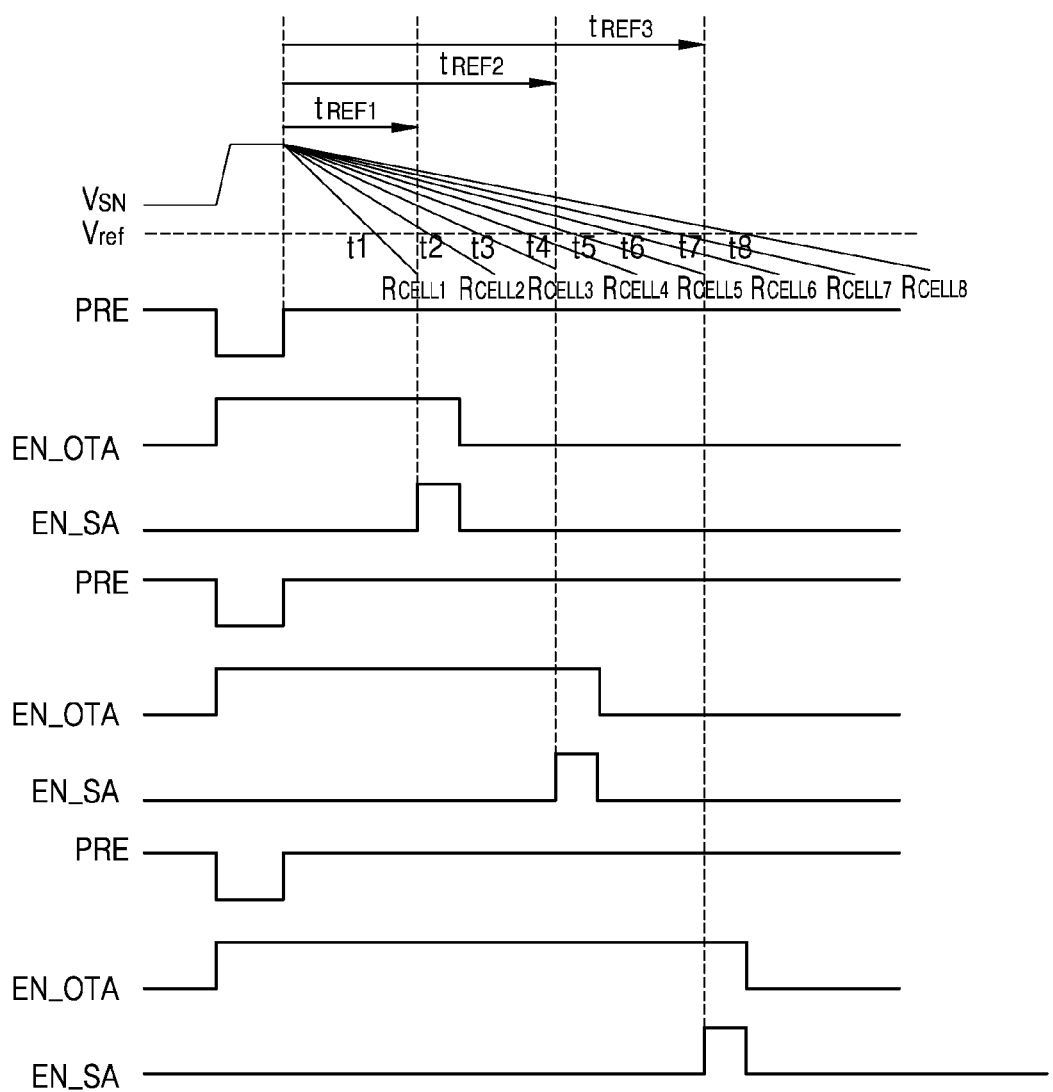
FIG. 13 illustrates a timing view for describing an operation of the read circuit of FIG. 9.

FIG. 13 illustrates a timing view for describing an operation of the read circuit 120A of FIG. 9. Referring to FIG. 13, the precharge enable signal PRE may be activated during a precharge period, and when the precharge enable signal PRE is activated, the precharge unit 121 may precharge the sensing voltage $V_{SN}$ corresponding to the bit line voltage $V_{BL}$ to a precharge voltage level. When the precharge enable signal PRE is deactivated, i.e., during a development period, the sensing voltage $V_{SN}$ may be decreased by the bit line voltage $V_{BL}$. In the current embodiment, the precharge unit 121 may be embodied by the PMOS transistor PM1, and thus the precharge enable signal PRE may have a low level during an activation period.

The OTA enable signal EN_OTA may be activated during a read period of the memory cell MC, and in detail, the OTA enable signal EN_OTA may be activated during a precharge period and a development period. Accordingly, in the current embodiment, the OTA enable signal EN_OTA may be activated during the precharge period, and thus, after the precharge operation has ended, the bit line voltage $V_{BL}$ may be controlled to be a constant voltage having a constant voltage level for any resistance of the memory cell MC.

When the sensing enable signal EN_SA is activated at a first reference time $t_{REF1}$, i.e., when the sensing time corresponds to a first threshold resistance $R_{th1}$, the sense amplifier 123 may perform a sensing operation at the first reference time $t_{REF1}$. For example, when a resistance level of the memory cell MC is $R_{CELL1}$, a cell current flowing in the memory cell MC may be relatively large. In this regard, the sensing voltage $V_{SN}$ may decrease relatively fast, and then the sensing voltage $V_{SN}$ may be lower than the reference voltage Vref at the sensing time (for example, $t_{SA}$ of FIG. 12). As a result, the sense amplifier 123 may output a logic level 0, and thus, data stored in the memory cell MC may be determined to be a first resistance state RS1.

When a resistance level of the memory cell MC is $R_{CELL2}$, a cell current flowing in the memory cell MC may be relatively small. In this regard, the sensing voltage $V_{SN}$ may decrease relatively slow and then, the sensing voltage $V_{SN}$ may be greater than the reference voltage Vref at the sensing time $t_{SA}$. As a result, the sense amplifier 123 may output a logic level 1, and thus, data stored in the memory cell MC may be determined to be one of second to fourth resistance states RS2 to RS4.

When the sensing enable signal EN_SA is activated at a second reference time $t_{REF2}$, i.e., when the sensing time $t_{SA}$ corresponds to a second threshold resistance $R_{th2}$, and the sense amplifier 123 may perform a sensing operation at the second reference time $t_{REF2}$. When a resistance level of the memory cell MC is $R_{CELL4}$, a cell current flowing in the memory cell MC may be relatively large. In this regard, the sensing voltage $V_{SN}$ may decrease relatively fast and then, the sensing voltage $V_{SN}$ may be lower than the reference voltage Vref at the sensing time $t_{SA}$. As a result, the sense amplifier 123 may output a logic level 0, and thus, data stored in the memory cell MC may be determined to be the second resistance state RS2.

When a resistance level of the memory cell MC is $R_{CELL5}$, a cell current flowing in the memory cell MC may be relatively small. In this regard, the sensing voltage $V_{SN}$ may decrease relatively slow, and then the sensing voltage $V_{SN}$ may be greater than the reference voltage Vref at the sensing time $t_{SA}$. As a result, the sense amplifier 123 may output a logic level 1, and thus, data stored in the memory cell MC may be determined to be the third resistance state RS3 or the fourth resistance state RS4.

When the sensing enable signal EN_SA is activated at a third reference time $t_{REF3}$, i.e., when the sensing time $t_{SA}$ corresponds to a third threshold resistance $R_{th3}$, the sense amplifier 123 may perform a sensing operation at the third reference time $t_{REF3}$. When a resistance level of the memory cell MC is $R_{CELL7}$, a cell current flowing in the memory cell MC may be relatively high. In this regard, the sensing voltage $V_{SN}$ may decrease relatively fast, and then the sensing voltage $V_{SN}$ may be lower than the reference voltage Vref at the sensing time $t_{SA}$. As a result, the sense amplifier 123 may output a logic level 0, and thus, data stored in the memory cell MC may be determined to be the third resistance state RS3.

When a resistance level of the memory cell MC is $R_{CELL8}$, a cell current flowing in the memory cell MC may be relatively small. In this regard, the sensing voltage $V_{SN}$ may decrease relatively slow and then, the sensing voltage $V_{SN}$ may be greater than the reference voltage Vref at the sensing time $t_{SA}$. As a result, the sense amplifier 123 may output a logic level 1, and thus, data stored in the memory cell MC may be determined to be the fourth resistance state RS4.

FIG. 13 illustrates a case in which the sensing enable signal EN_SA is activated once in a read operation performed on the memory cell MC. However, embodiments are not limited thereto. In some embodiments, the sensing enable signal EN_SA may be activated several times in a read operation performed on the memory cell MC. For example, the OTA enable signal EN_OTA may be maintained activated during a read period, and the sensing enable signal EN_SA may be provided as a pulse which is activated at each of the first, second, and third reference times $t_{REF1}$, $t_{REF2}$, and $t_{REF3}$.

Figure 14A:
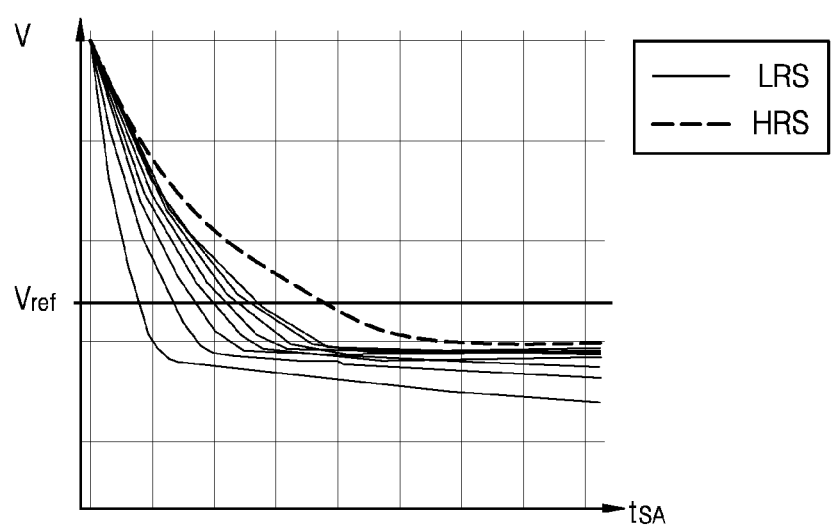
FIG. 14A illustrates an exemplary graph showing a sensing voltage with respect to a sensing time.

FIG. 14A illustrates a graph showing a sensing voltage with respect to a sensing time. Referring to FIG. 14A, the horizontal axis denotes the sensing time $t_{SA}$, and the vertical axis denotes a voltage V. The graph illustrated in FIG. 14A may correspond to a behavior of the sensing voltage $V_{SN}$ when the read circuit 120A of FIG. 9 does not include the OTA 122A. During a development period, the precharge unit 121 is deactivated, and thus an amount of current flowing in the capacitor $C_{SN}$ is the same as an amount of the cell current $I_{CELL}$ flowing in the memory cell MC. Accordingly, during the development period, an amount of electric charge accumulated in the capacitor $C_{SN}$ by the sensing time $t_{SA}$ may be represented by Formula 4 below.

$$Q = t_{SA} * I_{CELL} \quad \text{[Formula 4]}$$

An amount of electric charge Q may be represented by Formula 5 below by based on a change $\Delta V_{SN}$ of a sensing voltage up to the sensing time $t_{SA}$, during a development period.

$$Q = C_{SN} * \Delta V_{SN} \quad \text{[Formula 5]}$$

$I_{CELL}$ may be represented by $V_{CELL}/R$, and thus Formula 6 may be obtained from Formula 4 and Formula 5.

$$t_{SA} = (\Delta V_{SN} * C_{SN} * R)/V_{CELL} \quad \text{[Formula 6]}$$

$\Delta V_{SN}$ corresponds to a difference between a precharge voltage level Vpre and the reference voltage Vref, R denotes a resistance of the memory cell MC, and $V_{ELL}$ denotes a voltage of the memory cell MC that has various values depending on a resistance R of the memory cell MC. In this regard, the sensing time $t_{SA}$ may not be linearly proportional to the resistance R of the memory cell MC. As the resistance R of the memory cell MC increases, a time interval between which the sensing voltage $V_{SN}$ and the reference voltage Vref cross each other may decrease. As a result, a sensing accuracy for a multi-level cell may decrease.

Figure 14B:
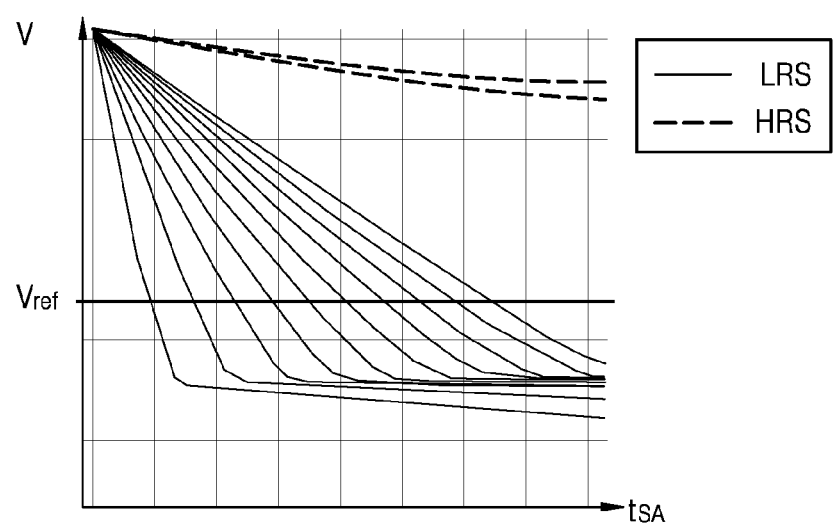
FIG. 14B illustrates a graph showing a sensing voltage with respect to a sensing time according to an embodiment.

FIG. 14B illustrates a graph showing a sensing voltage with respect to a sensing time according to an embodiment. Referring to FIG. 14B, the horizontal axis denotes the sensing time $t_{SA}$, and the vertical axis denotes the voltage V. The graph illustrated in FIG. 14B may correspond to a behavior of the sensing voltage $V_{SN}$ in the read circuit 120A of FIG. 9. In the current embodiment, the voltage controller 122 may control, independently from a resistance of the memory cell MC, the bit line voltage $V_{BL}$, i.e., the both-end voltage $V_{CELL}$ of the memory cell MC to be a constant voltage, and thus, the both-end voltage $V_{CELL}$ of the memory cell MC may be represented by a constant, not by a function. In this regard, the sensing time $t_{SA}$ according to the current embodiment may be represented by Formula 7 below.

$$t_{SA} = (\Delta V_{SN} * C_{SN} * R)/V_{CELL} \quad \text{[Formula 7]}$$

In the current embodiment, the sensing time $t_{SA}$ may be linearly proportional to the resistance R of the memory cell MC. Accordingly, independently from the resistance R of the memory cell MC, a time interval between which the sensing voltage $V_{SN}$ and the reference voltage Vref cross each other may be maintained to be substantially constant. As a result, a sensing accuracy for a multi-level cell may increase.

Figure 15:
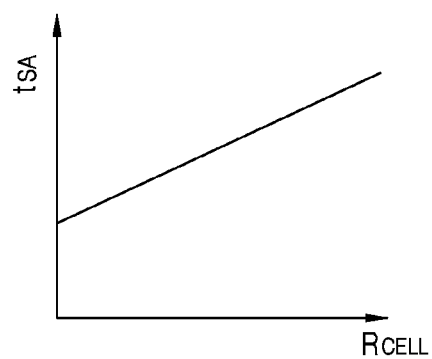
FIG. 15 illustrates a graph showing a sensing time with respect to a resistance of a memory cell according to an embodiment.

FIG. 15 illustrates a graph showing the sensing time $t_{SA}$ with respect to a resistance of a memory cell according to an embodiment. Referring to FIG. 15, the horizontal axis denotes a resistance of the memory cell MC, and the vertical axis denotes the sensing time $t_{SA}$. As described in Formula 7, in the current embodiment, a relation between the sensing time $t_{SA}$ and a resistance of the memory cell MC is linear. Accordingly, the relation between the sensing time $t_{SA}$ and a resistance of the memory cell MC may be as illustrated in FIG. 15.

Figure 16:
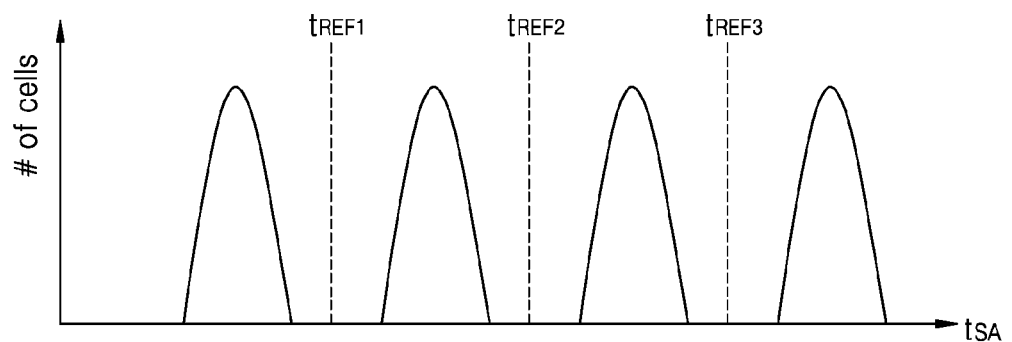
FIG. 16 illustrates a graph showing a distribution of memory cells with respect to a sensing time when a memory cell is a multi-level cell, according to an embodiment.

FIG. 16 illustrates a graph showing a distribution of memory cells with respect to a sensing time when a memory cell is a multi-level cell, according to an embodiment. Referring to FIG. 16, the horizontal axis denotes the sensing time $t_{SA}$, and the vertical axis denotes the number of memory cells. First, second, and third reference times $t_{REF1}$, $t_{REF2}$, and $t_{REF3}$ may refer to reference times for detecting data stored in a memory cell, and may respectively correspond to first, second, and third threshold resistances $R_{th1}$, $R_{th2}$, and $R_{th3}$.

In the current embodiment, as illustrated in FIG. 15, the resistance R of the memory cell MC may be linearly proportional to the sensing time $t_{SA}$. Accordingly, a relation between a sensing time and a sensing window may be linear as illustrated in FIG. 16.

Figure 17:
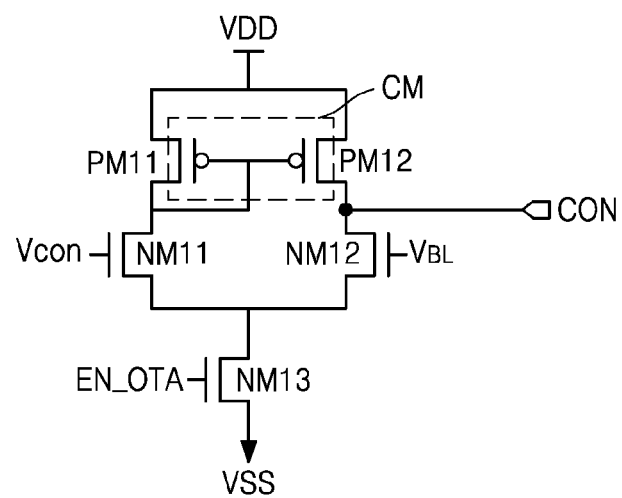
FIG. 17 illustrates a circuit diagram of an example of an operational transconductance amplifier (OTA) included in FIG. 9.

FIG. 17 illustrates a circuit diagram of an example of an OTA 122A included in FIG. 9. Referring to FIG. 17, the OTA 122A may include a current mirror CM and first, second, and third NMOS transistors NM11, NM12, and NM13. The current mirror CM may include first and second PMOS transistors PM11 and PM12, and the first PMOS transistor PM11 may include a source connected to a power voltage terminal VDD and a drain connected to a drain of the first NMOS transistor NM11. The second PMOS transistor PM12 may include a source connected to the power voltage terminal VDD, a gate connected to a gate of the first PMOS transistor PM11, and a drain connected to the output terminal.

The first NMOS transistor NM11 may include a drain connected to a drain of the first PMOS transistor PM11, a gate to which the input voltage Vcon is applied, and a source connected to a drain of the third NMOS transistor NM13. The second NMOS transistor NM12 may include a drain connected to the output terminal, a gate to which the bit line voltage $V_{BL}$ is applied, and a source connected to a drain of the third NMOS transistor NM13. The third NMOS transistor NM13 may include a drain connected to sources of the first and second NMOS transistors NM11 and NM12, a gate to which the OTA enable signal EN_OTA is applied, and a source connected to a ground terminal VSS.

Figure 18:
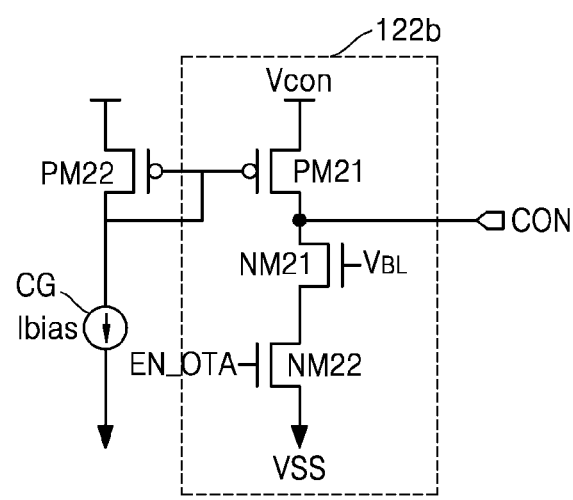
FIG. 18 illustrates a circuit diagram of another example of an OTA included in FIG. 9.

FIG. 18 illustrates a circuit diagram showing another example of an OTA 122B included in FIG. 9. Referring to FIG. 18, the OTA 122B may include a first PMOS transistor PM21, and first and second NMOS transistors NM21 and NM22. The first PMOS transistor PM21 may include a source to which the input voltage Vcon is applied, a gate connected to a gate of a second PMOS transistor PM22, and a drain connected to the output terminal.

The first NMOS transistor NM21 may include a drain connected to the output terminal, a gate to which the bit line voltage $V_{BL}$ is applied, and a source connected to a drain of the second NMOS transistor NM22. The second NMOS transistor NM22 may include a gate to which the OTA enable signal EN_OTA is applied, and a source connected to the ground terminal VSS.

The second PMOS transistor PM22 and a current generator CG may be included in the control logic 130. The second PMOS transistor PM22 may form a current mirror with the first PMOS transistor PM21. The current generator CG may generate a bias current Ibias, and the generated bias current Ibias may be mirrored by the first and second PMOS transistors PM21 and PM22 to flow in the OTA 122B.

Figure 19:
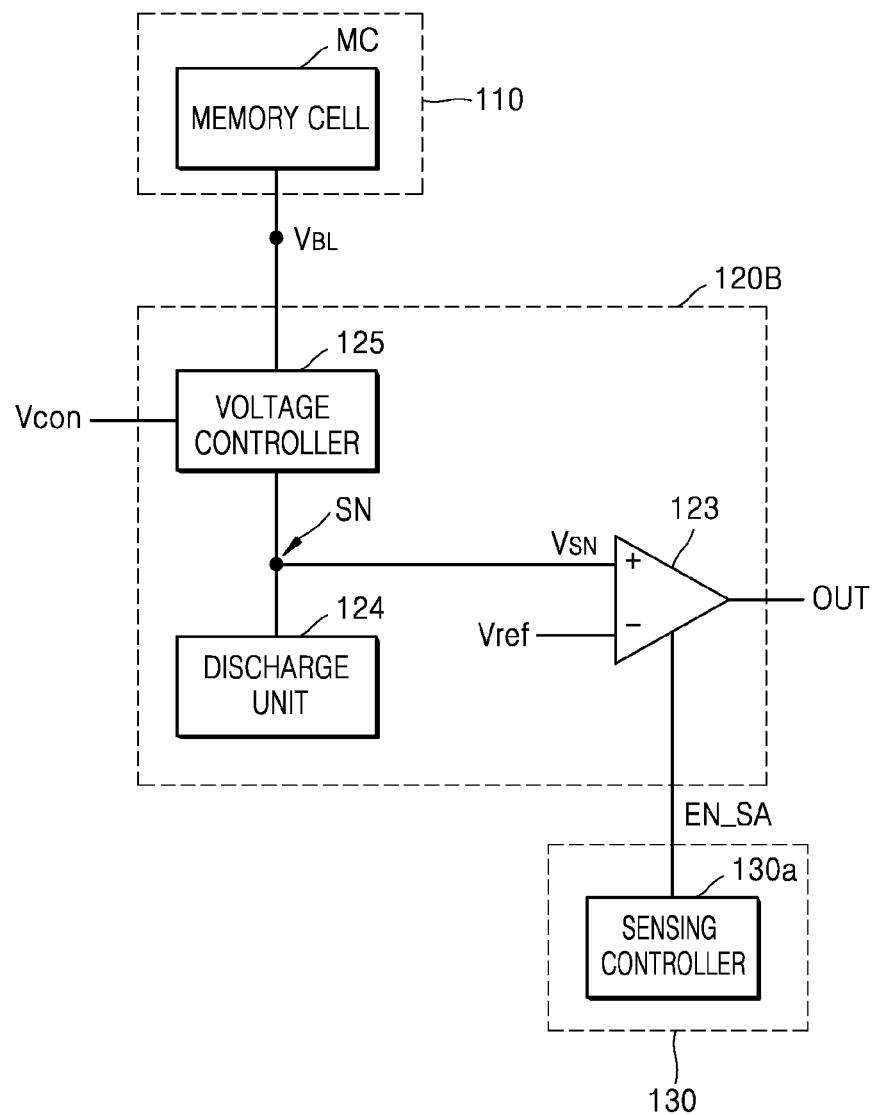
FIG. 19 illustrates a block diagram showing an example of a memory device 100*b* including a read circuit 120B according to another embodiment.

FIG. 19 illustrates a block diagram showing an example of a memory device 100b including a read circuit 120B according to another embodiment. Referring to FIG. 19, a memory cell array 110 may include a memory cell MC, the memory cell MC may be connected to the read circuit 120B via a first signal line. Hereinafter, a case in which the first signal line is a bit line (for example, BL of FIG. 2) will be described. In an embodiment, an end of the memory cell MC may be connected to the bit line, and the other end thereof may be connected to a word line (for example, WL of FIG.

2). In a read operation performed on the memory cell MC, a voltage of the word line may be substantially a power voltage level. In this regard, a voltage of the memory cell MC, i.e., a cell voltage, may correspond to a bit line voltage $V_{BL}$.

The read circuit 120B may include a discharge unit 124, a voltage controller 125 and a sense amplifier 123. The discharge unit 124 may be configured to discharge the bit line BL during a discharge period. When the discharge period ends and a development period starts, the discharge unit 124 may be deactivated, and thus, a discharge operation for the bit line BL may be completed. The discharge unit 124 may be connected to the voltage controller 125 and the sense amplifier 123 via a sensing node SN.

The voltage controller 125 may be connected to the memory cell MC via the bit line BL. In the current embodiment, the voltage controller 125 may be configured to use the bit line voltage $V_{BL}$ as feedback to generate a control signal changed by the bit line voltage $V_{BL}$, and may control the bit line voltage $V_{BL}$ to be a constant voltage, based on the generated control signal. In detail, the voltage controller 125 may generate a control signal based on a difference between an input voltage Vcon having a constant voltage level and the bit line voltage $V_{BL}$, and may control the bit line voltage $V_{BL}$ to be a constant voltage according to the generated control signal.

The sense amplifier 123 may be connected to the voltage controller 125 via the sensing node SN, and may be configured to detect data stored in the memory cell MC by comparing a sensing voltage $V_{SN}$ of the sensing node SN with a reference voltage Vref. In detail, the sense amplifier 123 may be enabled according to a sensing enable signal EN_SA, and may perform a comparison operation in which the sensing voltage $V_{SN}$ is compared with the reference voltage Vref in an activation period of the sensing enable signal EN_SA.

The control logic 130 may include the sensing controller 130a. However, embodiments are not limited thereto. In some embodiments, the sensing controller 130a may be included in the memory controller 200. In the current embodiment, the sensing controller 130a may g be configured to generate the sensing enable signal EN_SA activated at multiple reference times that respectively correspond to multiple threshold resistances for reading data.

Figure 20:
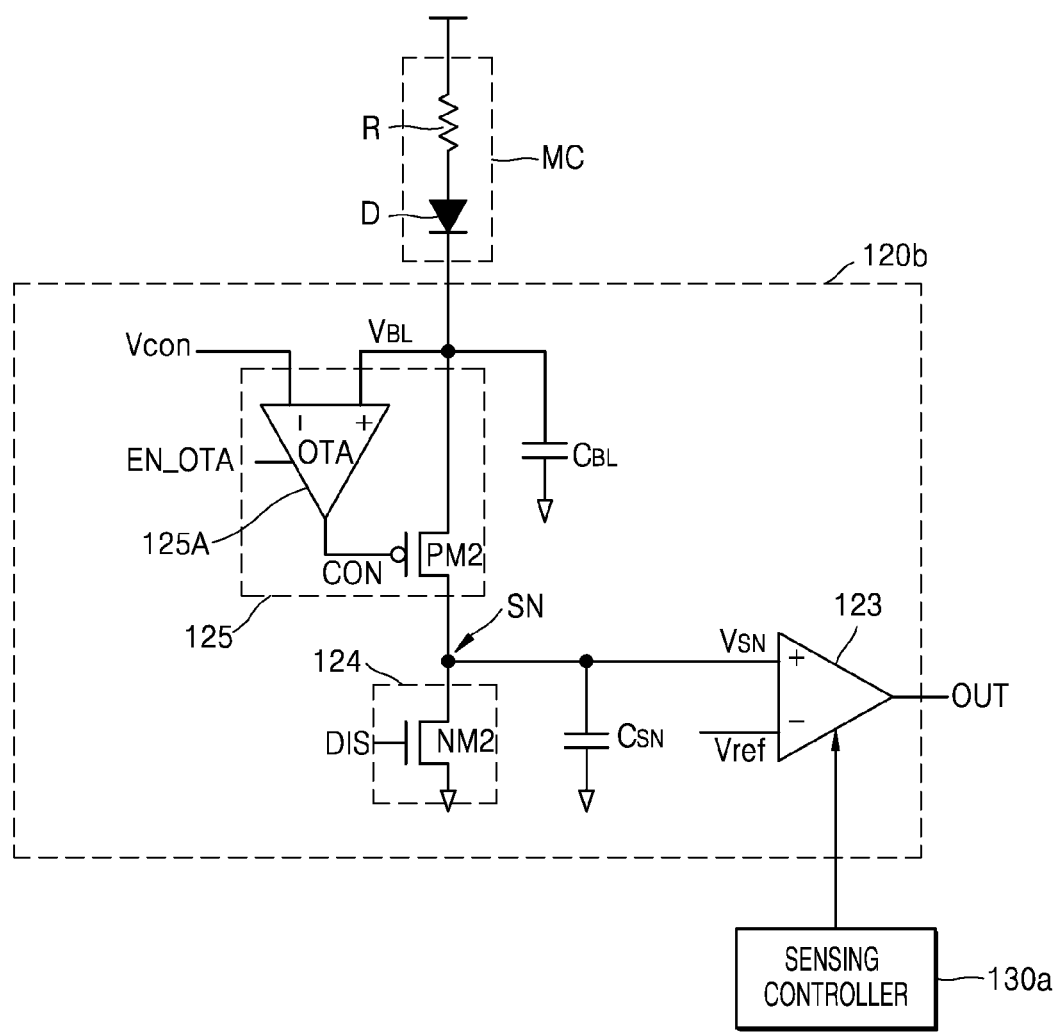
FIG. 20 illustrates a circuit diagram showing an example of a read circuit 120*b* according to another embodiment.

FIG. 20 illustrates a circuit diagram showing an example of a read circuit 120b according to another embodiment. Referring to FIG. 20, the discharge unit 124 may include an NMOS transistor NM2 having a source connected to a ground terminal, a gate to which a discharge enable signal DIS is applied, and a drain connected to a sensing node SN. The discharge enable signal DIS may be activated during a discharge period, and may be provided from the control logic 130. When the discharge enable signal DIS is activated, the NMOS transistor NM2 is turned on and then, a voltage level of the sensing node SN may correspond to a ground voltage level.

The voltage controller 125 may include an OTA 125A and a PMOS transistor PM2. The OTA 125A may be configured to use a bit line voltage $V_{BL}$ as positive feedback, and thus, may generate a control signal CON changed by the bit line voltage $V_{BL}$. The PMOS transistor PM2 may be configured to control the bit line voltage $V_{BL}$ to be a constant voltage according to the control signal CON.

The OTA 125A may include a first input terminal for receiving an input voltage Vcon that has a constant voltage level, a second input terminal for receiving the bit line voltage $V_{BL}$, and an output terminal providing the control signal CON. In the current embodiment, the first input terminal may be an inverting terminal, and the second input terminal may be a non-inverting terminal. In this regard, the OTA 125A may use the bit line voltage $V_{BL}$ as positive feedback and thus, may generate the control signal CON changed by the bit line voltage $V_{BL}$.

The OTA 125A may be configured to be enabled during an activation period of an OTA enable signal EN_OTA to generate the control signal CON. The OTA enable signal EN_OTA may be activated during a read period for a memory cell MC. In the current embodiment, the OTA enable signal EN_OTA may be activated during a discharge period and a development period.

The PMOS transistor PM2 may include a drain connected to the sensing node SN, a gate to which the control signal CON is applied, and a source connected to the memory cell MC. The PMOS transistor PM2 may clamp the bit line voltage $V_{BL}$ into a range suitable for reading. In this regard, the PMOS transistor PM2 may be referred to as a clamping transistor. In detail, the PMOS transistor PM2 may be configured to clamp the bit line voltage $V_{BL}$ to be a constant level according to the control signal CON.

In the current embodiment, the input voltage Vcon is a constant voltage having a constant voltage level, and thus, the bit line voltage $V_{BL}$ may also be a constant voltage having a constant voltage level. In this regard, in the current embodiment, the voltage controller 125 may control the bit line voltage $V_{BL}$ to be a constant voltage, independently from a resistance of the memory cell MC.

A sense amplifier 123 may include a first input terminal to which a sensing voltage $V_{SN}$ is applied, and a second input terminal to which the reference voltage Vref is applied, and may be enabled during an activation period of the sensing enable signal EN_SA to generate an output signal OUT. In the current embodiment, the first input terminal may be a non-inverting input terminal, and the second input terminal may be an inverting input terminal. For example, when the sensing voltage $V_{SN}$ is greater than the reference voltage Vref, a logic level of the output signal OUT may be 1, and when the sensing voltage $V_{SN}$ is less than the reference voltage Vref, a logic level of the output signal OUT may be 0.

Figure 21A:
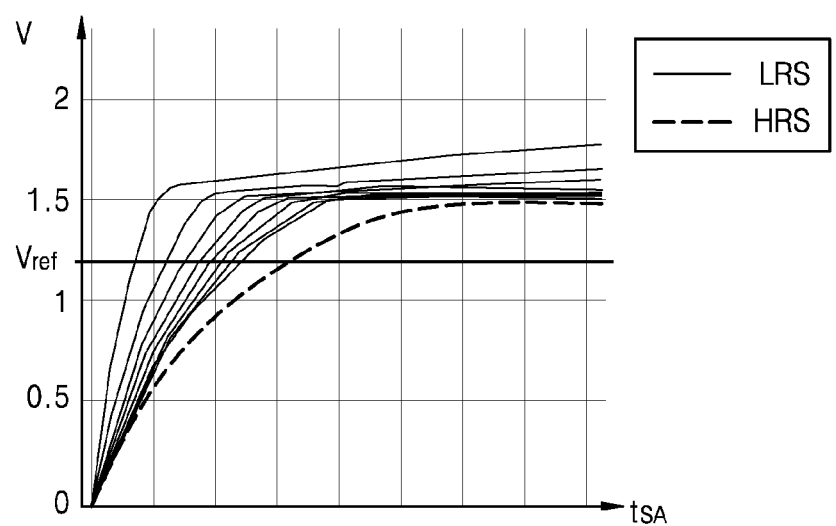
FIG. 21A illustrates an exemplary graph showing a sensing voltage with respect to a sensing time.

FIG. 21A illustrates a graph showing a sensing voltage with respect to a sensing time. Referring to FIG. 21A, the horizontal axis denotes the sensing time $t_{SA}$, and the vertical axis denotes a voltage V. The graph of FIG. 21A may correspond to a behavior of the sensing voltage $V_{SN}$ when the read circuit 120B of FIG. 20 does not include the OTA 125A. As described with reference to FIG. 14A, when an OTA is not included in a read circuit, the resistance R of the memory cell MC may be linearly proportional to the sensing time $t_{SA}$ according to Formula 6 above. In this regard, as the resistance R of the memory cell MC increases, a time interval between which the sensing voltage $V_{SN}$ and the reference voltage Vref cross each other may decrease. Accordingly, a sensing accuracy for a multi-level cell may decrease.

Figure 21B:
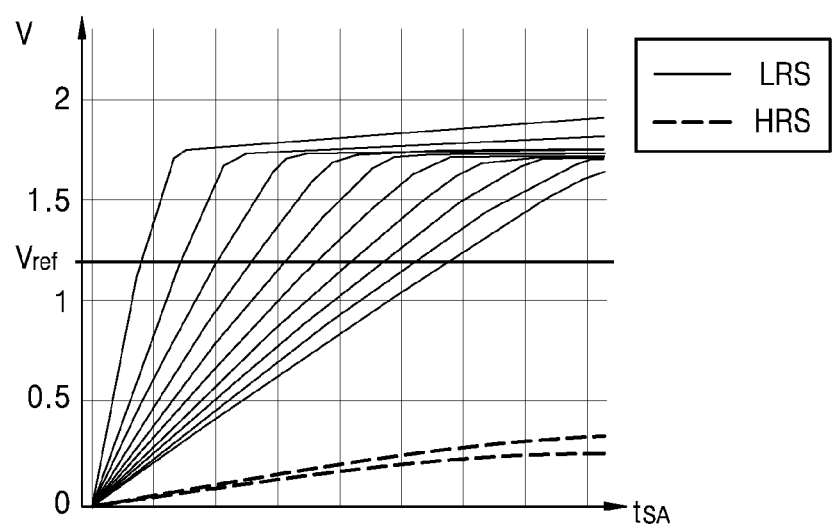
FIG. 21B illustrates a graph showing a sensing voltage with respect to a sensing time according to another embodiment.

FIG. 21B illustrates a graph showing a sensing voltage with respect to a sensing time according to another embodiment of embodiments. Referring to FIG. 21B, the horizontal axis denotes the sensing time $t_{SA}$, and the vertical axis denotes the voltage V. The graph of FIG. 21B may correspond to a flow of the sensing voltage $V_{SN}$ in the read circuit 120B of FIG. 20. In the current embodiment, the voltage controller 125 may control the bit line voltage $V_{BL}$, i.e., the both-end voltage $V_{CELL}$ of the memory cell MC to be a constant voltage, independently from a resistance of the memory cell MC. Thus, the both-end voltage WELL of the memory cell MC may not be represented by a function and may be a constant. Accordingly, the sensing time $t_{SA}$ according to the current embodiment may be represented by $t_{SA}=(\Delta V_{SN}*C_{SN}*R)/V_{CELL}$ as described in Formula 7.

In the current embodiment, the sensing time $t_{SA}$ may be linearly proportional to the resistance R of the memory cell MC. In this regard, independently from the resistance R of the memory cell MC, a time interval in which the sensing voltage $V_{SN}$ crosses the reference voltage Vref may be maintained to be constant. Accordingly, a sensing accuracy for a multi-level cell may increase.

Figure 22A:
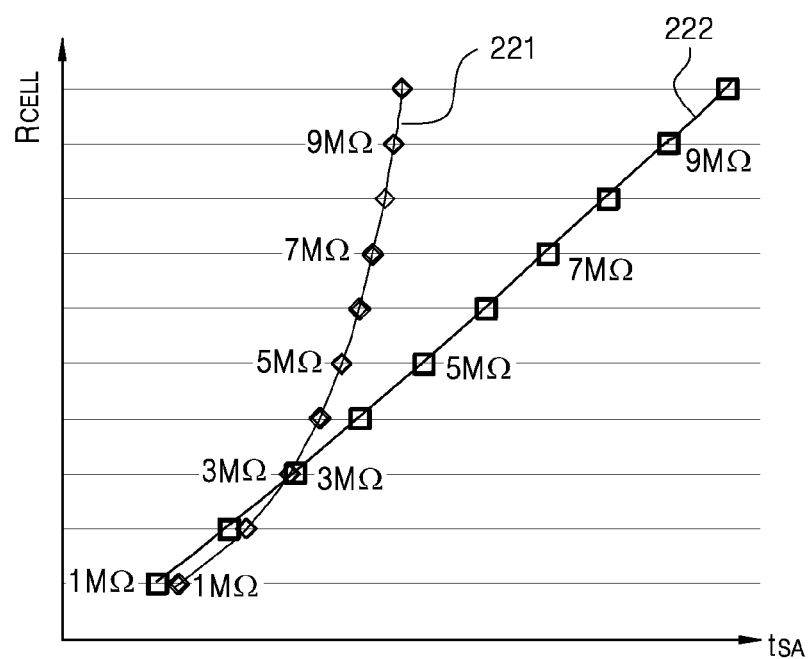
FIG. 22A illustrates a graph showing a cell resistance with respect to a sensing time in a low resistance range, according to some embodiments.

FIG. 22A illustrates a graph showing a cell resistance $R_{CELL}$ with respect to the sensing time $t_{SA}$ in a low resistance range, according to some embodiments. Referring to FIG. 22A, the horizontal axis denotes the sensing time $t_{SA}$, and the vertical axis denotes a resistance of a memory cell. A line of a reference number 221 shows a relation between a resistance and the sensing time $t_{SA}$, according to a conventional art, while a line of a reference number 222 shows a relation between a resistance and the sensing time $t_{SA}$ according to at least some of the current embodiments. In detail, reference numbers 221 and 222 respectively show a relation between a resistance and the sensing time $t_{SA}$ when a resistance of a memory cell is a low resistance state LRS.

According to the conventional art, a relation between a resistance and the sensing time $t_{SA}$ is non-linear, whereas, according to at least some of the embodiments, a relation between a resistance and the sensing time $t_{SA}$ is linear. Accordingly, when a memory cell is a multi-level cell or a triple-level cell, linearity of a sensing window is improved if not guaranteed, and thus a read reliability for data stored in a memory cell may increase.

Figure 22B:
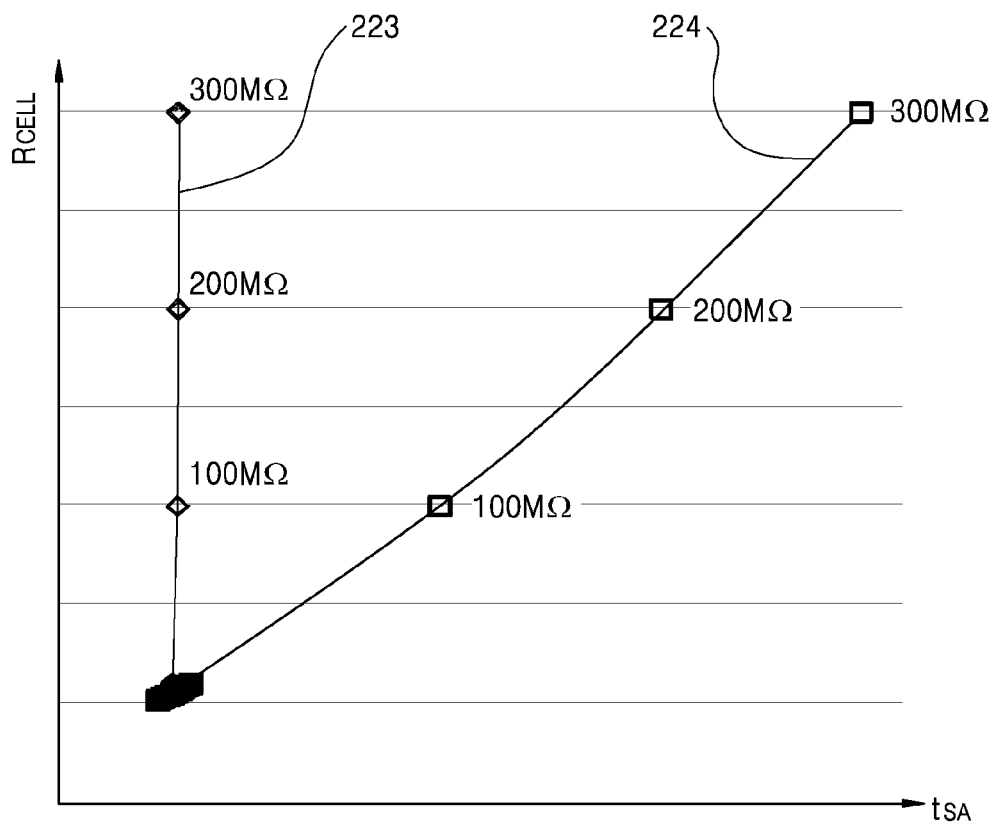
FIG. 22B illustrates a graph showing a relation between a cell resistance and a sensing time over all resistance ranges, according to some embodiments.

FIG. 22B illustrates a graph showing a relation between a cell resistance and the sensing time $t_{SA}$ over all resistance ranges, according to some embodiments. Referring to FIG. 22B, the horizontal axis denotes the sensing time $t_{SA}$, and the vertical axis denotes a resistance of a memory cell. A line of a reference number 223 shows a relation between a resistance and the sensing time $t_{SA}$ according to a conventional art whereas a line of a reference number 224 shows a relation between a resistance and the sensing time $t_{SA}$ according to at least some of the embodiments. In detail, lines of reference numbers 223 and 224 respectively show a relation between a resistance of a memory cell and the sensing time $t_{SA}$ over more resistance ranges including a low resistance state LRS and a high resistance state HRS.

Comparing FIG. 22B with FIG. 22A, the relation between a resistance and the sensing time $t_{SA}$ according to at least some of the embodiments is improved, compared to the relation between a resistance and the sensing time $t_{SA}$ according to the conventional art. According to some embodiments, the relation between a resistance and the sensing time $t_{SA}$ may be linear in a high resistance state HRS. Accordingly, data stored in a memory cell may sufficiently secure a sensing window by adjusting a sensing time even in a high resistance state, and thus, a read reliability for the data stored in the memory cell may increase.

Figure 23:
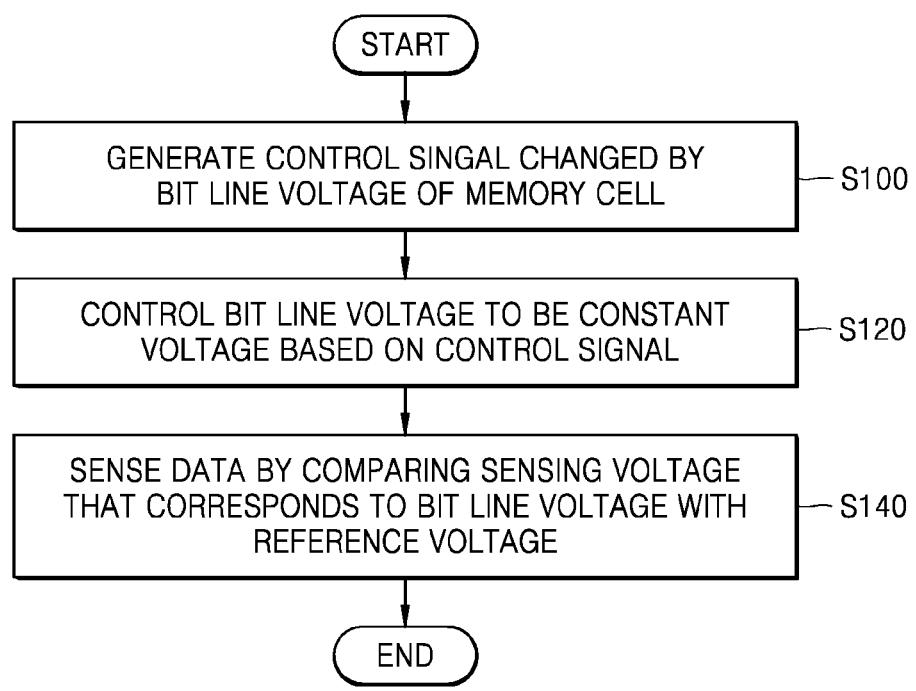
FIG. 23 illustrates a flowchart showing a method of operating a memory device, according to an embodiment.

FIG. 23 illustrates a flowchart showing a method of operating a memory device, according to an embodiment of embodiments. Referring to FIG. 23, according to the method of operating a memory device, a read operation for memory cells is performed. Descriptions provided with reference to FIGS. 1 to 22 also apply to the method of FIG. 23. Hereinafter, referring to FIGS. 1 to 22, the method of operating a memory device according to the current embodiment will be described in detail.

In operation S100, a control signal changed by a bit line voltage of a memory cell may be generated. In an embodiment, a bit line voltage may be negatively fed back, and thus a control signal may be generated. In some embodiments, a bit line voltage may be used as positive feedback, and thus a control signal may be generated. However, embodiments are not limited thereto. In some embodiments, a read circuit may be connected to a word line of a memory cell, and thus, a control signal changed by a word line voltage of a memory cell may be generated.

In operation S120, the bit line voltage may be controlled to be a constant voltage, based on the control signal. In this regard, in the current embodiment, the bit line voltage may be maintained to be a constant voltage level, independently from a resistance of a memory cell. Accordingly, a resistance may be linearly proportional to a sensing time, and thus, a read reliability for a multi-level cell may increase.

In operation S140, data is sensed by comparing a sensing voltage that corresponds to the bit line voltage with a reference voltage. In the current embodiment, a sensing time at which a sensing enable signal is activated may be changed depending on a resistance state to read, and when the sensing enable signal is activated, an operation of comparing a sensing voltage with a reference voltage may be performed.

Figure 24:
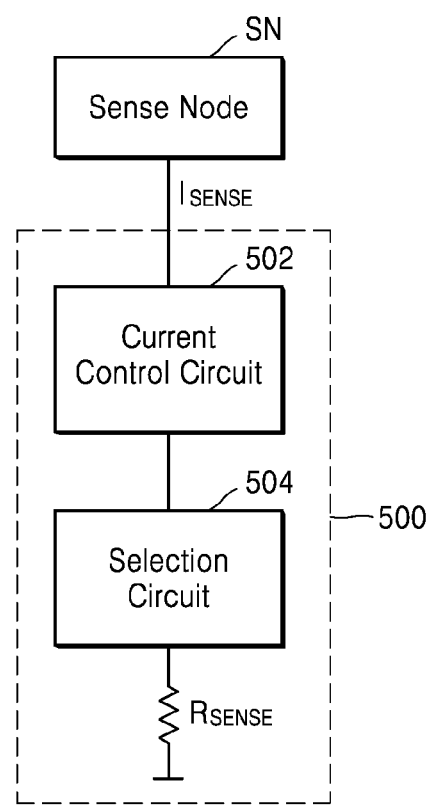
FIG. 24 illustrates a block diagram of a current source according to some embodiments.

FIG. 24 illustrates a block diagram of a current source according to some embodiments. In some embodiments, the current source 500 is coupled to a sense node SN. The sense node SN may be a node such as the sense nodes SN described above. That is, the sense node SN may be a node coupled to a sense amplifier, such as a sense amplifier 123 described above, configured to compare a voltage of the sense node to a reference voltage to generate an output signal.

The current source 500 includes a current control circuit 502, a selection circuit 504 and a sense resistor $R_{SENSE}$. Although a single sense resistor $R_{SENSE}$ is illustrated, the sense resistor $R_{SENSE}$ is merely representative of a resistor among multiple resistors that is switched to be coupled to the current control circuit 502 by the selection circuit 504. That is, the selection circuit 504 is a circuit configured to electrically couple the current control circuit 502 to any one of multiple resistors.

For example, the selection circuit 504 may include the column decoder 160 described above; however, in other embodiments, different circuits may be used to selectively couple a resistor to the current control circuit 502 as a sense resistor $R_{SENSE}$. The resistor selected as the sense resistor $R_{SENSE}$ may be one of the variable resistors of the memory cell array 110 described above.

The current control circuit 502 may be configured to use the sense resistor $R_{SENSE}$ to set the output current $I_{SENSE}$. Accordingly, when a sense resistor $R_{SENSE}$ is selected, the current source 500 may become a constant current source with a current $I_{SENSE}$ set by the resistance of the sense resistor $R_{SENSE}$. In particular, the current control circuit 502 may be configured to output the current $I_{SENSE}$ that is linearly proportional to the sense resistor $R_{SENSE}$. Accordingly, if the sense resistor $R_{SENSE}$ is a resistor of a memory cell array 110 described above, the output current $I_{SENSE}$ may be proportional to the state of the resistor of a selected memory cell.

In some embodiments, the current $I_{SENSE}$ may be substantially equal to the current passing through the sense resistor $R_{SENSE}$. However, in other embodiments, the current $I_{SENSE}$ may different from but proportional to the current passing through the sense resistor $R_{SENSE}$.

The current control circuit 502 may include any of the voltage controllers 122, 125, or the like described above. However, the current control circuit 502 can include any circuit that can generate an output current linearly proportional to a set resistor. Furthermore, although the term "current source" has been used as an example, the current source 500 may be a current sink depending on the configuration of the sense amplifiers, power supplies, and the like.

Figure 25:
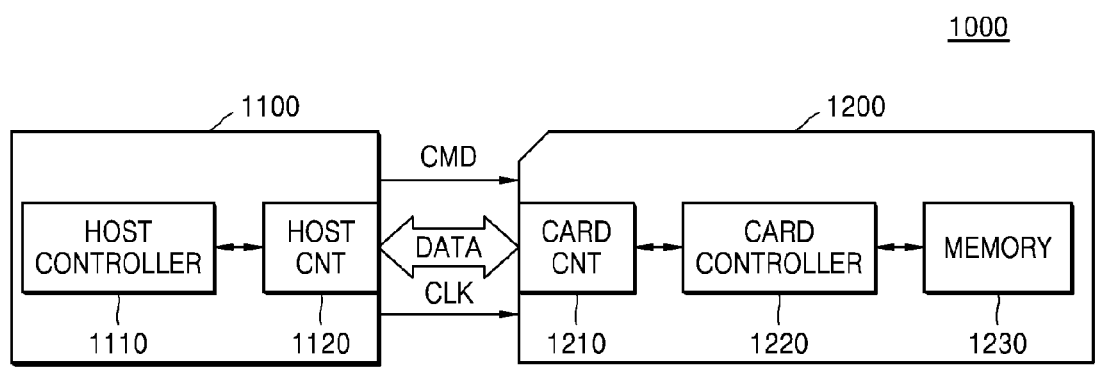
FIG. 25 illustrates a block diagram showing an example in which a memory system according to some embodiments is applied to a memory card system.

FIG. 25 illustrates a block diagram showing an example in which a memory system according to some embodiments is applied to a memory card system 1000. Referring to FIG. 25, the memory card system 1000 may include a host 1100 and a memory card 1200. The host 1100 may include a host controller 1110 and a host connector 1120. The memory card 1200 may include a card connector 1210, a card controller 1220 and a memory 1230. Here, the memory card 1200 may include any the embodiments described with reference to FIGS. 1 to 24.

The host 1100 may be configured to write data in the memory card 1200, or read data stored in the memory card 1200. The host controller 1110 may be configured to transmit a command CMD, a clock signal CLK that is generated by a clock generator (not shown) of the host 1100, and data DATA to the memory card 1200 via the host connector 1120.

The card controller 1220 may be configured to synchronize data with a clock signal that is generated by a clock generator (not shown) in the card controller 1220 to store the data in the memory 1230, in response to the command CMD received via the card connector 1210. The memory 1230 may be configured to store the data DATA transmitted from the host 1100.

The memory card 1200 may be a compact flash card (CFC), a microdrive), a smart media card (SMC), a multimedia card (MMC), a security digital card (SDC), a memory stick, a USB flash memory driver or the like.

FIG. 25 illustrates a block diagram showing a computing system 2000 that includes a memory system according to some embodiments. Referring to FIG. 25, the computing system 2000 may include a memory system 2100, a processor 2200, a RAM 2300, an I/O unit 2400, and a power supply 2500. Although not illustrated in FIG. 25, the computing system 2000 may be configured to communicate with a video card, a sound card, a memory card, a USB device, or the like, or may further include ports via which the computing system 2000 may communicate with other electronic devices. The computing system 2000 may be at least a part of a personal computer, or by a portable electronic device such as a laptop computer, a cellular phone, a personal digital assistant (PDA) and a camera.

The processor 2200 may be configured to perform a certain calculation or task. In some embodiments, the processor 2200 may be a micro-processor or a central processing unit (CPU). The processor 2200 may be configured to communicate with the RAM 2300, the I/O unit 2400 and the memory system 2100 via a bus 2600 such as an address bus, a control bus and a data bus. Here, the memory system 2100 may include any of the embodiments of FIGS. 1 to 24.

In some embodiments, the processor 2200 may be connected to an extension bus such as a peripheral component interconnect (PCI).

A RAM 2300 may be configured to store data required for an operation of the computing system 2000. For example, the RAM 2300 may be embodied by DRAM, mobile DRAM, SRAM, PRAM, FRAM, RRAM and/or MRAM. The RAM 2300 may include any of the embodiments of FIGS. 1 to 24.

The I/O unit 2400 may include an input device such as a keyboard, a keypad, and a mouse, and an output device such as a printer, and a display. The power supply 2500 may be configured to provide an operation voltage required for an operation of the computing system 2000.

Figure 26:
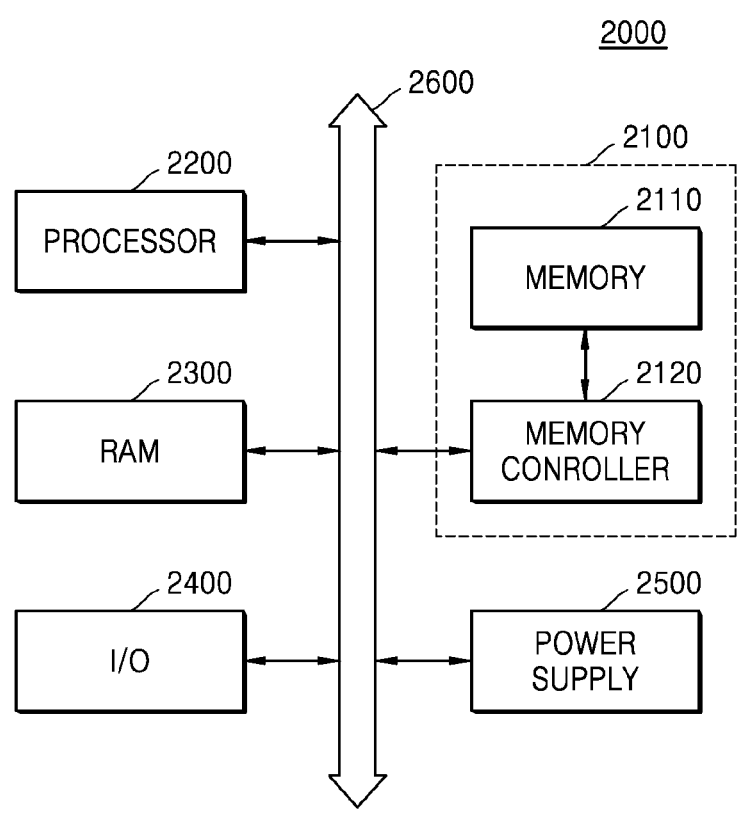
FIG. 26 illustrates a block diagram showing a computing system that includes a memory system according to some embodiments.
Figure 27:
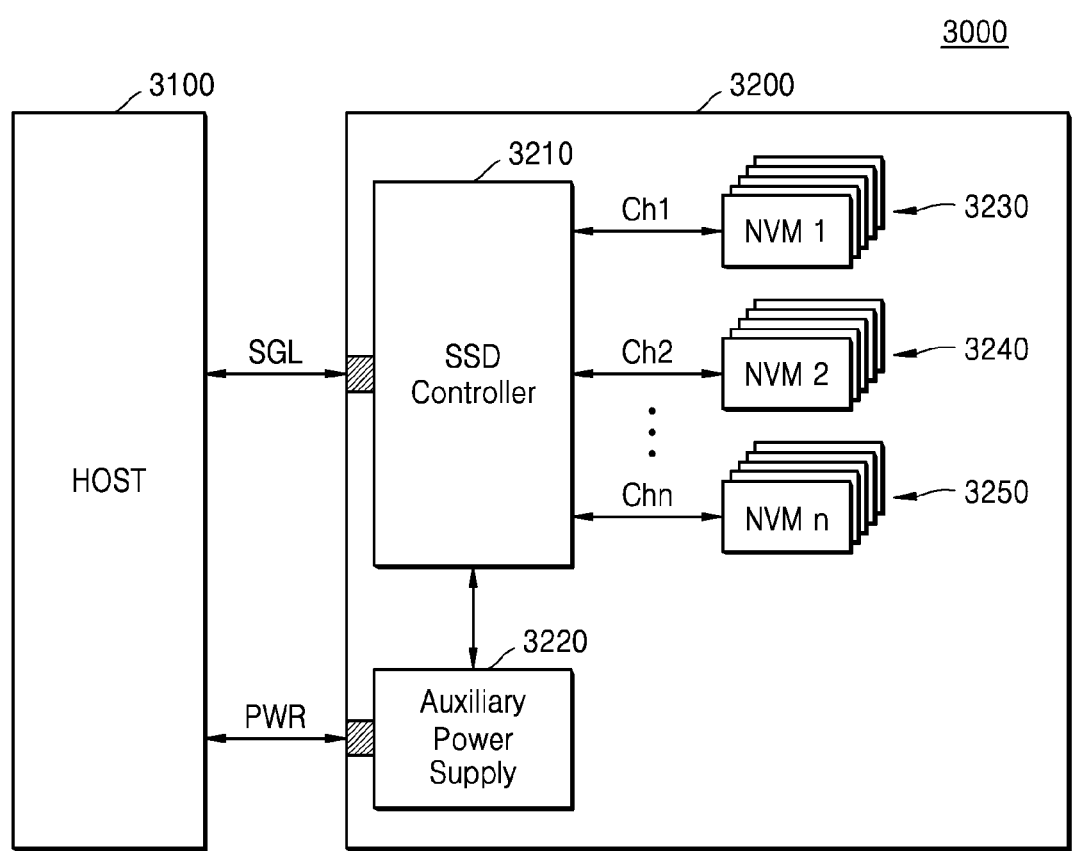
FIG. 27 illustrates a block diagram showing an example in which a memory system according to some embodiments is applied to a SSD system.

FIG. 26 illustrates a block diagram showing an example in which a memory system according to some embodiments is applied to a SSD system 3000. Referring to FIG. 26, the SSD system 3000 may include a host 3100 and a SSD 3200. The SSD 3200 may be configured to transmit and receive a signal to and from the host 3100 via a signal connector, and a power connector may input power to the SSD 3200. The SSD 3200 may include a SSD controller 3210, an auxiliary power supply 3220 and multiple non-volatile memory devices 3230, 3240, and 3250. Here, the SSD 3200 may include any of the embodiments of FIGS. 1 to 26.

Embodiments include a resistive memory device and a memory system including the resistive memory device.

Some embodiments include a resistive memory device including a memory cell having a resistance level that is changed by stored data; and a read circuit configured to be connected to the memory cell via a first signal line and read the stored data, wherein the read circuit includes a voltage controller that generates a control signal changed by a first voltage of the first signal line by feeding back the first voltage, and controls the first voltage to be a constant voltage based on the generated control signal; and a sense amplifier that is connected to the voltage controller via a sensing node, and detects the stored data by comparing a sensing voltage of the sensing node with a reference voltage.

Some embodiments include a memory system including a resistive memory device and a memory controller controlling the resistive memory device, wherein the resistive memory device includes a memory cell storing at least 2-bit data and having a resistance level changed according to the at least 2 bit data; a read circuit configured to be connected to the memory cell via a first signal line and read the at least 2 bits of data, the read circuit including a voltage controller that generates a control signal changed by a voltage of the first signal line by feeding back the voltage, and controls the voltage to be a constant voltage based on the generated control signal, and a sense amplifier that is connected to the voltage controller via a sensing node and senses the at least 2 data by comparing a sensing voltage of the sensing node with a reference voltage; and a sensing controller configured to generate a sensing enable signal that is activated at reference times respectively corresponding to a plurality of threshold resistances for reading the at least 2 bit data, and provide the generated sensing enable signal to the sense amplifier.

While embodiments have been particularly shown and described with reference to particular embodiments, it will be understood that various changes in form and details may be made therein without departing from the spirit and scope of the following claims.

What is claimed is:
1. A resistive memory device comprising:
a memory cell having a programmable resistance representing stored data; and
a read circuit configured to be connected to the memory cell via a first signal line and read the stored data,
wherein the read circuit includes:
a voltage controller configured to control a first voltage of the first signal line to be a constant voltage and output a signal to a sensing node, the voltage controller comprising a clamping transistor including a first terminal connected to the first signal line, a second terminal connected to the sensing node, and a control terminal; and a sense amplifier connected to the voltage controller via the sensing node, and configured to compare a sensing voltage of the sensing node with a reference voltage.

2. The resistive memory device of claim 1, wherein the voltage controller comprises:

an operational transconductance amplifier (OTA) including a first input terminal configured to receive an input voltage, a second input terminal configured to receive the first voltage, and an output terminal coupled to the control terminal configured to output a control signal.

3. The resistive memory device of claim 2, wherein the OTA is configured to receive an OTA enable signal and enable based on the OTA enable signal.

4. The resistive memory device of claim 3, wherein the OTA comprises:

a first transistor having a gate configured to receive the input voltage;

a second transistor having a drain connected to the output terminal, and a gate configured to receive the first voltage;

a third transistor connected to sources of the first and second transistors and having a gate configured to receive the OTA enable signal; and a current mirror connected to drains of the first and second transistors.

5. The resistive memory device of claim 3, wherein the OTA comprises:

a first transistor having a source configured to receive the input voltage;

a second transistor having a drain connected to a drain of the first transistor and the output terminal, and a gate configured to receive the first voltage; and a third transistor having a gate configured to receive the OTA enable signal and connected to a source of the second transistor.

6. The resistive memory device of claim 3, further comprising:

a control logic configured to generate a precharge enable signal and the OTA enable signal;

wherein:

the read circuit further comprises a precharge unit configured to precharge the sensing node to a precharge voltage level in response to the precharge enable signal;

the control logic is configured to activate the OTA enable signal when the precharge enable signal is activated and during a development period for the sensing node; and the sense amplifier is configured to sense the stored data based on a period during which the sensing voltage is discharged by the voltage controller.

7. The resistive memory device of claim 3, further comprising:

a control logic configured to generate a discharge enable signal and the OTA enable signal;

wherein:

the read circuit further comprises a discharge unit configured to discharge the sensing node to be a ground voltage level;

the control logic is configured to activate the OTA enable signal when the discharge enable signal is activated and during a development period for the sensing node; and the sense amplifier is configured to sense the stored data based on a period during which the sensing voltage is charged by the voltage controller.

8. The resistive memory device of claim 2, further comprising:

a sensing controller configured to generate a sensing enable signal, wherein the sense amplifier is enabled based on the sensing enable signal.

9. The resistive memory device of claim 8, wherein the sensing controller comprises a resistor;

a second OTA including a first input terminal configured to receive a ramp voltage, a second input terminal configured to receive a voltage of the resistor, and an output terminal configured to output a second control signal;

a clamping transistor connected between the resistor and a second sensing node, including a control terminal coupled to the output terminal;

a current generator configured to provide a reference current to the second sensing node;

a comparator configured to compare a second sensing voltage of the second sensing node with a second reference voltage; and a pulse generator configured to generate a pulse signal as the sensing enable signal, in response to the comparator.

10. The resistive memory device of claim 9, wherein the sensing controller further comprises a precharge unit configured to precharge the second sensing voltage to a precharge voltage level.

11. The resistive memory device of claim 9, wherein the sensing controller further comprises a discharge unit configured to discharging the second sensing voltage to a ground voltage level.

12. The resistive memory device of claim 9, wherein the current generator is further configured to generate the reference current based on an activation time of the sensing enable signal.

13. The resistive memory device of claim 8, wherein the sensing controller comprises a clock generator or a plurality of delay units configured to control an activation time of the sensing enable signal.

14. The resistive memory device of claim 1, wherein the first signal line is a bit line.

15. A memory system, comprising:

a resistive memory device and a memory controller configured to control the resistive memory device, wherein the resistive memory device comprises:

a memory cell configured to store at least 2 bits of data in a programmable resistance;

a read circuit configured to be connected to the memory cell via a first signal line and read the at least 2 bits of data, the read circuit including:

a voltage controller configured to control a first voltage of the first signal line to be a constant voltage and output a signal to a sensing node, the voltage controller comprising a clamping transistor including a first terminal connected to the first signal line, a second terminal connected to the sensing node, and a control terminal; and a sense amplifier connected to the voltage controller via the sensing node and configured to compare a sensing voltage of the sensing node with a reference voltage; and a sensing controller configured to generate a sensing enable signal that is activated at reference times respectively corresponding to a plurality of threshold resistances for reading the at least 2 bits of data, and provide the sensing enable signal to the sense amplifier.

16. A resistive memory device comprising:
a plurality of memory cells, each memory cell having a programmable resistance representing stored data;
a read circuit; and
a column decoder configured to selectively couple a selected memory cell of the memory cells to the read circuit;
wherein the read circuit comprises a current control circuit configured to provide a constant current to a sense node based on the programmable resistance of the selected memory cell, the current control circuit being connected between the selected memory cell and the sense node.

17. The resistive memory device of claim 16, further comprising a sense amplifier configured to compare a voltage on the sense node to a reference voltage.

18. The resistive memory device of claim 16, further comprising:
a control logic configured to generate a first control signal and a second control signal; and
a precharge circuit configured to precharge the sense node to a precharge voltage in response to the first control signal;
wherein:
the current control circuit is configured to provide the constant current to the sense node in response to the second control signal; and
the control logic is configured to activate the first control signal and second control signal during a precharge period.

19. The resistive memory device of claim 16, further comprising:
a control logic configured to generate a first control signal and a second control signal; and
a sense amplifier configured to be enabled in response to the first control signal;
wherein:
the current control circuit is configured to provide the constant current to the sense node in response to the second control signal; and
the control logic is configured to activate the first control signal and second control signal during a development period.

20. The resistive memory device of claim 19, wherein the control logic is configured to generate the first control signal and the second control signal for multiple different time periods when reading multiple bits encoded in the programmable resistance of a memory cell.

* * * * *